(12) United States Patent
Tojima

(10) Patent No.: US 6,448,827 B1
(45) Date of Patent: Sep. 10, 2002

(54) THREE-PHASE PULSE WIDTH MODULATION WAVEFORM GENERATOR

(75) Inventor: Hidetoshi Tojima, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/722,013

(22) Filed: Nov. 27, 2000

(30) Foreign Application Priority Data

Nov. 26, 1999 (JP) ............................................. 11-336629

(51) Int. Cl.[7] .................................................. H03K 3/17
(52) U.S. Cl. ........................ 327/172; 327/175; 327/178; 377/44; 377/126
(58) Field of Search ................................ 327/172, 173, 327/174, 175, 178; 377/124, 125, 126, 44, 45, 46

(56) References Cited

U.S. PATENT DOCUMENTS

| | | | | |
|---|---|---|---|---|
| 4,095,165 A | * | 6/1978 | Boros ............................ | 323/17 |
| 4,722,094 A | * | 1/1988 | Goodzey ...................... | 377/23 |
| 4,727,468 A | * | 2/1988 | Maekawa ..................... | 363/41 |
| 5,193,122 A | * | 3/1993 | Kowalski et al. .............. | 382/9 |
| 5,194,794 A | | 3/1993 | Shamoto ...................... | 318/603 |
| 5,309,079 A | * | 5/1994 | Takada ......................... | 318/811 |
| 5,500,627 A | * | 3/1996 | Hulsing, II .................. | 331/1 A |
| 5,519,397 A | | 5/1996 | Chapotot et al. ............ | 341/155 |
| 5,663,616 A | * | 9/1997 | Stringfellow et al. ........ | 318/254 |
| 5,883,590 A | * | 3/1999 | Sugden et al. .............. | 341/164 |

FOREIGN PATENT DOCUMENTS

| | | |
|---|---|---|
| EP | 0 187 282 A2 | 7/1986 |
| EP | 0 409 185 A2 | 1/1991 |
| JP | A 1-321722 | 12/1989 |
| JP | A 8-322261 | 12/1996 |
| JP | A 9-215334 | 8/1997 |
| JP | A 10-112982 | 4/1998 |

\* cited by examiner

*Primary Examiner*—Timothy P. Callahan
*Assistant Examiner*—An T. Luu
(74) *Attorney, Agent, or Firm*—Young & Thompson

(57) ABSTRACT

The present invention provides a three-phase pulse width modulation waveform generator having at least an up-down counting circuitry which comprises: an up-down counter for performing an up-count or a down-count upon an external input of a count clock signal; and a count controller having an output side connected to an input side of the up-down counter for sending the input side of the up-down counter a count enable signal which enables the up-down counter to perform the up-count or the down-count.

12 Claims, 25 Drawing Sheets

Pulse width modulation output process

Timing setting process

Pulse width modulation output process

THREE-PHASE PULSE WIDTH MODULATION WAVEFORM GENERATOR

BACKGROUND OF THE INVENTION

The present invention relates to a pulse width modulation inverter for varying speed of an AC-motor, and more particularly to a three-phase pulse width modulation waveform generator to be used for an inverter which uses a high speed switching such as a compound semiconductor bipolar transistor.

A triangle pulse wave modulation method is one of methods for generating a pulse width modulation signal. FIG. 1 is a diagram illustrative of waveforms of sign waves (U, V, W) and triangle wave for explaining a triangle pulse wave modulation method. The sign waves (U, V, W) are modulated with the triangle wave 401.

The three-phase pulse width modulation waveform generator comprises a first pulse width modulation waveform generator circuit for generating +U-phase and −U-phase pulse width modulation waveforms, a second pulse width modulation waveform generator circuit for generating +V-phase and −V-phase pulse width modulation waveforms, and a third pulse width modulation waveform generator circuit for generating +W-phase and −W-phase pulse width modulation waveforms. FIG. 2A is a circuit diagram illustrative of a circuit configuration of a first pulse width modulation waveform generator circuit for generating +U-phase and −U-phase pulse width modulation waveforms in a conventional three-phase pulse width modulation waveform generator. The first pulse width modulation waveform generator circuit of the three-phase pulse width modulation waveform generator has the following circuit elements. An up-down counter 1 which receives a count clock 2 is provided for performing up-count and down-count. A count register 3 is connected to the up-down counter 1 for storing a switching value and sending the switching value to the up-down counter 1 so that the up-down counter 1 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 1. A comparative register 7 is connected to the comparator 6. The comparative register 7 stores data for generating a U-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 1 for receiving one of count direction signals 11 which indicate the up-count and the down-count from the up-down counter 1. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +U-phase pulse width modulation signal 15 and a −U-phase pulse width modulation signal 16. A first three-state buffer 17 is provided which has an input terminal connected to the waveform generator 14 for receiving the +U-phase pulse width modulation signal 15 from the waveform generator 14. The first three-state buffer 17 receives an output stop signal 19, so that the first three-state buffer 17 stops the output of the +U-phase pulse width modulation signal 15. A second three-state buffer 18 is provided which has an input terminal connected to the waveform generator 14 for receiving the −U-phase pulse width modulation signal 16 from the waveform generator 14. The second three-state buffer 18 receives the output stop signal 19, so that the second three-state buffer 18 stops the output of the −U-phase pulse width modulation signal 16.

FIG. 2B is a circuit diagram illustrative of a circuit configuration of a second pulse width modulation waveform generator circuit for generating +V-phase and −V-phase pulse width modulation waveforms in the conventional three-phase pulse width modulation waveform generator. The second pulse width modulation waveform generator circuit of the three-phase pulse width modulation waveform generator has the same circuit elements as the first pulse width modulation waveform generator circuit. Namely, an up-down counter 1 which receives a count clock 2 is provided for performing up-count and down-count. A count register 3 is connected to the up-down counter 1 for storing a switching value and sending the switching value to the up-down counter 1 so that the up-down counter 1 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 1. A comparative register 7 is connected to the comparator 6. The comparative register 7 stores data for generating a V-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 1 for receiving one of count direction signals 11 which indicate the up-count and the down-count from the up-down counter 1. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +V-phase pulse width modulation signal 15 and a −V-phase pulse width modulation signal 16. A first three-state buffer 17 is provided which has an input terminal connected to the waveform generator 14 for receiving the +V-phase pulse width modulation signal 15 from the waveform generator 14. The first three-state buffer 17 receives an output stop signal 19, so that the first three-state buffer 17 stops the output of the +V-phase pulse width modulation signal 15. A second three-state buffer 18 is provided which has an input terminal connected to the waveform generator 14 for receiving the −V-phase pulse width modulation signal 16 from the waveform generator 14. The second three-state buffer 18 receives the output stop signal 19, so that the second three-state buffer 18 stops the output of the −V-phase pulse width modulation signal 16.

FIG. 2C is a circuit diagram illustrative of a circuit configuration of a third pulse width modulation waveform generator circuit for generating +W-phase and −W-phase pulse width modulation waveforms in the conventional three-phase pulse width modulation waveform generator. The third pulse width modulation waveform generator circuit of the three-phase pulse width modulation waveform generator has the same circuit elements as the first pulse width modulation waveform generator circuit. Namely, an up-down counter 1 which receives a count clock 2 is provided for performing up-count and down-count. A count register 3 is connected to the up-down counter 1 for storing a switching value and sending the switching value to the up-down counter 1 so that the up-down counter 1 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 1. A comparative register 7 is connected to the comparator 6. The comparative register 7 stores data for generating a W-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 1 for receiving one of count direction signals 11 which indicate the up-count and the down-count from the up-down counter 1. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +W-phase pulse width modulation signal 15 and a −W-phase pulse width modulation signal 16. A first three-state buffer 17 is provided which has an input terminal connected to the waveform generator 14 for receiving the +W-phase pulse width modulation signal 15 from the waveform generator 14. The first three-state buffer 17 receives an output stop signal 19, so that the first three-state buffer 17 stops the output of the +W-phase pulse width modulation signal 15. A second three-state buffer 18 is provided which has an input terminal connected to the waveform generator 14 for receiving the −W-phase pulse width modulation signal 16 from the waveform generator 14. The second three-state buffer 18 receives the output stop signal 19, so that the second three-state buffer 18 stops the output of the −W-phase pulse width modulation signal 16.

As described above, the first, second and third pulse width modulation waveform generator circuits of the three-phase pulse width modulation waveform generator have the same circuit configuration as each other, provided that the up-down counter 1, the count resistor 3 and the buffer resistor 4 are commonly provided to the first, second and third pulse width modulation waveform generator circuits, for which reason processes for generating the pulse width modulation signals will be described by taking the first pulse width modulation waveform generator circuit as one example. FIG. 3 is a diagram illustrative of waveforms of signals to explain operations of generating +W-phase and −W-phase pulse width modulation waveforms in the first pulse width modulation waveform generator circuit of FIG. 2A of the three-phase pulse width modulation waveform generator.

The first buffer register 4 allows a central processing unit not illustrated to re-write or re-set data to be stored therein. Upon receipt of the first transfer enable signal 5, the first buffer register 4 transfers the data to the count register 3. The second buffer register 8 also allows a central processing unit not illustrated to re-write or re-set data to be stored therein. Upon receipt of the second transfer enable signal 9, the second buffer register 8 transfers the data to the comparative register 7. A 0-detected signal of the up-down counter 1 is used as the transfer enable signal.

The up-down counter 1 operates in accordance with the count clock 2 externally supplied. If an up-counted value of the up-down counter 1 is made correspond to the value supplied from the count register 3 during the up-count operation of the up-down counter 1, then the up-counter 1 stops the up-count operation and in place starts the down-count. Namely, upon correspondence between the up-counted value of the up-down counter 1 and the value supplied from the count register 3, the up-down counter 1 switches the up-count operation to the down-count operation. If a down-counted value becomes 0 during the down-count operation of the up-down counter 1, the up-down counter 1 stops the down-count operation and in place starts the up-count. Namely, if the down-counted value becomes 0, then the up-down counter 1 switches the down-count operation to the up-count operation.

The comparator 6 receives the counted value from the up-down counter 1 and also receives the U-phase pulse width modulation signal generation data from the comparative register 7 for comparing the counted value with the U-phase pulse width modulation signal generation data. If the counted value corresponds to the U-phase pulse width modulation signal generation data, then the comparator 6 generates the correspondence-detected signal 12 which is transmitted to both the delay circuit 10 and the waveform generator 14. The delay circuit 10 receives the correspondence-detected signal 12 from the comparator 6 for generating the delay signal 13 which indicates the dead-time for preventing the short circuit formation. The waveform generator 14 receives the count direction signal 11 from the up-down counter 1 and also receives the correspondence-detected signal 12 from the comparator 6 as well as receives the delay signal 13 from the delay circuit 10, so that the waveform generator 14 generates the +U-phase pulse width modulation signal 15 and the −U-phase pulse width modulation signal 16. The first three-state buffer 17 receives the +U-phase pulse width modulation signal 15 from the waveform generator 14. The first three-state buffer 17 also receives the output stop signal 19, so that the first three-state buffer 17 stops the output of the +U-phase pulse width modulation signal 15 upon receipt of the output stop signal 19. The second three-state buffer 18 receives the −U-phase pulse width modulation signal 16 from the waveform generator 14. The second three-state buffer 18 also receives the output stop signal 19, so that the second three-state buffer 18 stops the output of the −U-phase pulse width modulation signal 16 upon receipt of the output stop signal 19.

FIG. 4 is a flow chart illustrative of a pulse width modulation output process by a central processing unit. The pulse width modulation output process is made as follows. In the first step S31, it is verified that the frequency change is required. If required, in the second step S32, the frequency is changed, before in the third step S33, the timing is set. If not required, in the third step S33, the timing-setting process is carried out as shown in FIG. 5.

FIG. 5 is a flow chart illustrative of a timing-setting process by a central processing unit. The timing-setting process is carried out as follows. In a first step S20, a sine wave table is referred to obtain data, wherein an address to be referred is calculated on the basis of a step address which has been previously set in accordance with the output frequency thereby obtaining the sine wave data. In a second step S21, a product of the V/f modulation rate is calculated to obtain timing data, wherein the V/f modulation rate has previously been set. In a third step S22, an off-set correction is made on the basis of the off-set correction value which has previously been set. In a fourth step S23, a timing is set by setting the timing data to the buffer registers of the first, second and third pulse width modulation waveform generator circuits of the three-phase pulse width modulation waveform generator.

FIG. 6 is a flow chart illustrative of an output frequency change process by a central processing unit. In a first step S24, a step address is set. In a second step S25, the V/f modulation rate is set. In a third step S26, an off-set correction value is set.

The first pulse width modulation waveform generator circuit for generating +U-phase and −U-phase pulse width modulation waveforms in the conventional three-phase pulse width modulation waveform generator need to set the buffer registers with the carrier cycle data which correspond to the A, B and C in FIG. 3 to be used in this carrier cycle and also with comparative data which correspond to D, E, and F in FIG. 3, until the start of each carrier cycle, for which reason the central processing unit prepares data to be written to the buffer register in accordance with the expected pulse width modulation waveform for every carrier cycles.

The second pulse width modulation waveform generator circuit for generating +V-phase and −V-phase pulse width modulation waveforms in the conventional three-phase pulse width modulation waveform generator need to set the buffer registers with the carrier cycle data to be used in this carrier cycle and also with comparative data, until the start of each carrier cycle, for which reason the central processing unit prepares data to be written to the buffer register in accordance with the expected pulse width modulation waveform for every carrier cycles.

The third pulse width modulation waveform generator circuit for generating +W-phase and −W-phase pulse width modulation waveforms in the conventional three-phase pulse width modulation waveform generator need to set the buffer registers with the carrier cycle data to be used in this carrier cycle and also with comparative data, until the start of each carrier cycle, for which reason the central processing unit prepares data to be written to the buffer register in accordance with the expected pulse width modulation waveform for every carrier cycles.

The values to be set are calculated by operations of the central processing unit. The central processing unit performs operations in correspondence with the expected output frequency on the basis of the basic sine wave data table which has already been prepared in the memory.

The central processing unit operate the setting data corresponding to the U-phase, the V-phase and the W-phase for every carrier cycles so as to write the setting data into the buffer register of each of the first, second and third pulse width modulation waveform generator circuits for generating +U-phase and −U-phase pulse width modulation waveforms, +V-phase and −V-phase pulse width modulation waveforms, and +W-phase and −W-phase pulse width modulation waveforms in the conventional three-phase pulse width modulation waveform generator. In order to change the output frequency, it is necessary to set parameters to be used in the operations of the central processing unit in accordance with the output frequency in addition to the above processes. This means that the load to the throughput of the central processing unit is large.

Further, it is necessary that the parameters, for example, the step address, the V/f modulation rate, and the off-set correction value, to be used in the timing setting process have previously be calculated in accordance with the output frequency. It is necessary for changing the output frequency to perform both the frequency change process and the timing setting process. This means that the load to the throughput of the central processing unit is large.

In the above circumstances, it had been required to develop a novel three-phase pulse width modulation waveform generator free from the above problem.

SUMMARY OF THE INVENTION

Accordingly, it is an object of the present invention to provide a novel three-phase pulse width modulation waveform generator free from the above problems.

It is a further object of the present invention to provide a novel three-phase pulse width modulation waveform generator which is capable of reducing the load to the central processing unit in generating the three-phase pulse width modulation waveforms.

It is a still further object of the present invention to provide a novel three-phase pulse width modulation waveform generator which is capable of reducing the load to the central processing unit in the process for changing the output frequency in order to generate the three-phase pulse width modulation waveforms.

It is yet a further object of the present invention to provide a novel three-phase pulse width modulation waveform generator which is capable of changing carrier cycles by switching count cycles of an up-down counter, which serve as a base for the carrier frequency, wherein the switch is made without discontinuation of the counting operation of the up-down counter.

It is a further more object of the present invention to provide a novel three-phase pulse width modulation waveform generator which allows that a sine wave data group on a sine wave table has been referred prior to changing the carrier cycle, before this sine wave data group is utilized as another sine wave data group for a different output frequency, whereby it is unnecessary to calculate a table address in correspondence with the output frequency in referring the sine wave table.

It is more over object of the present invention to provide a novel three-phase pulse width modulation waveform generator which allows that a sine wave data group on a sine wave table has been referred prior to changing the carrier cycle, before this sine wave data group is utilized as another sine wave data group for a different output frequency, whereby it is unnecessary to calculate a step address to be used for operation for the table address.

The first present invention provides a three-phase pulse width modulation waveform generator having at least an up-down counting circuitry which comprises: an up-down counter for performing an up-count or a down-count upon an external input of a count clock signal; and a count controller having an output side connected to an input side of the up-down counter for sending the input side of the up-down counter a count enable signal which enables the up-down counter to perform the up-count or the down-count.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
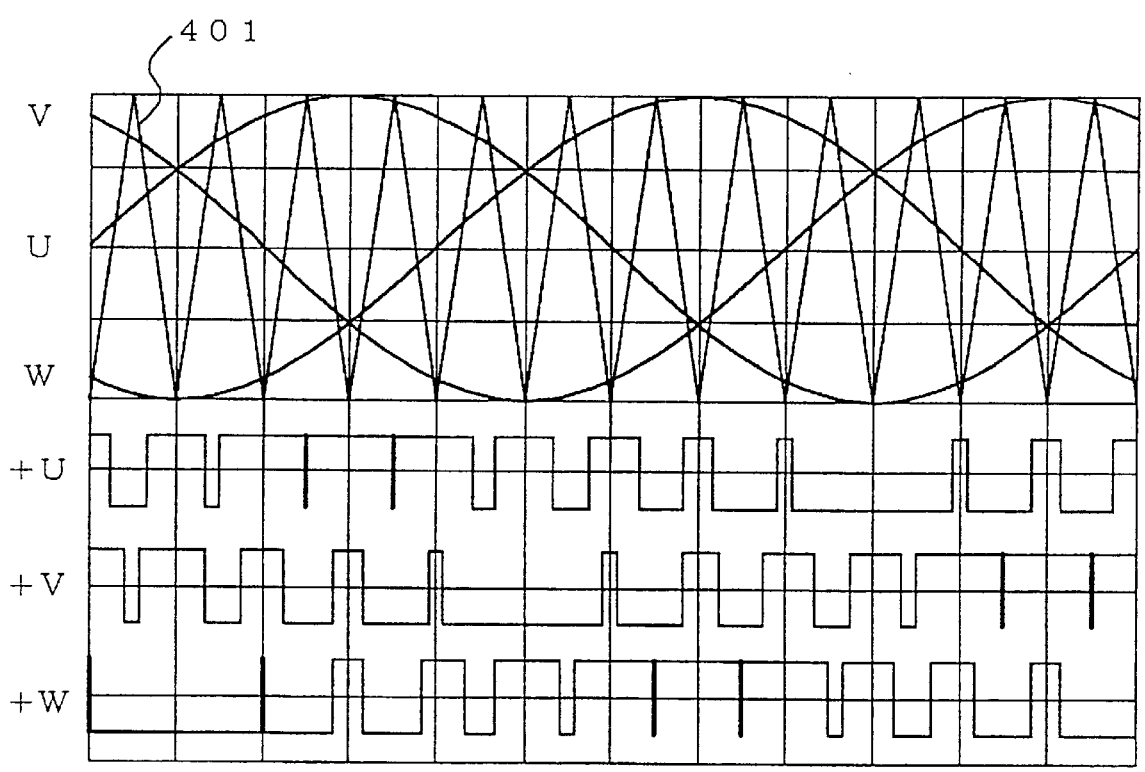
FIG. 1 is a diagram illustrative of waveforms of sign waves (U, V, W) and triangle wave for explaining a triangle pulse wave modulation method.
Figure 2A:
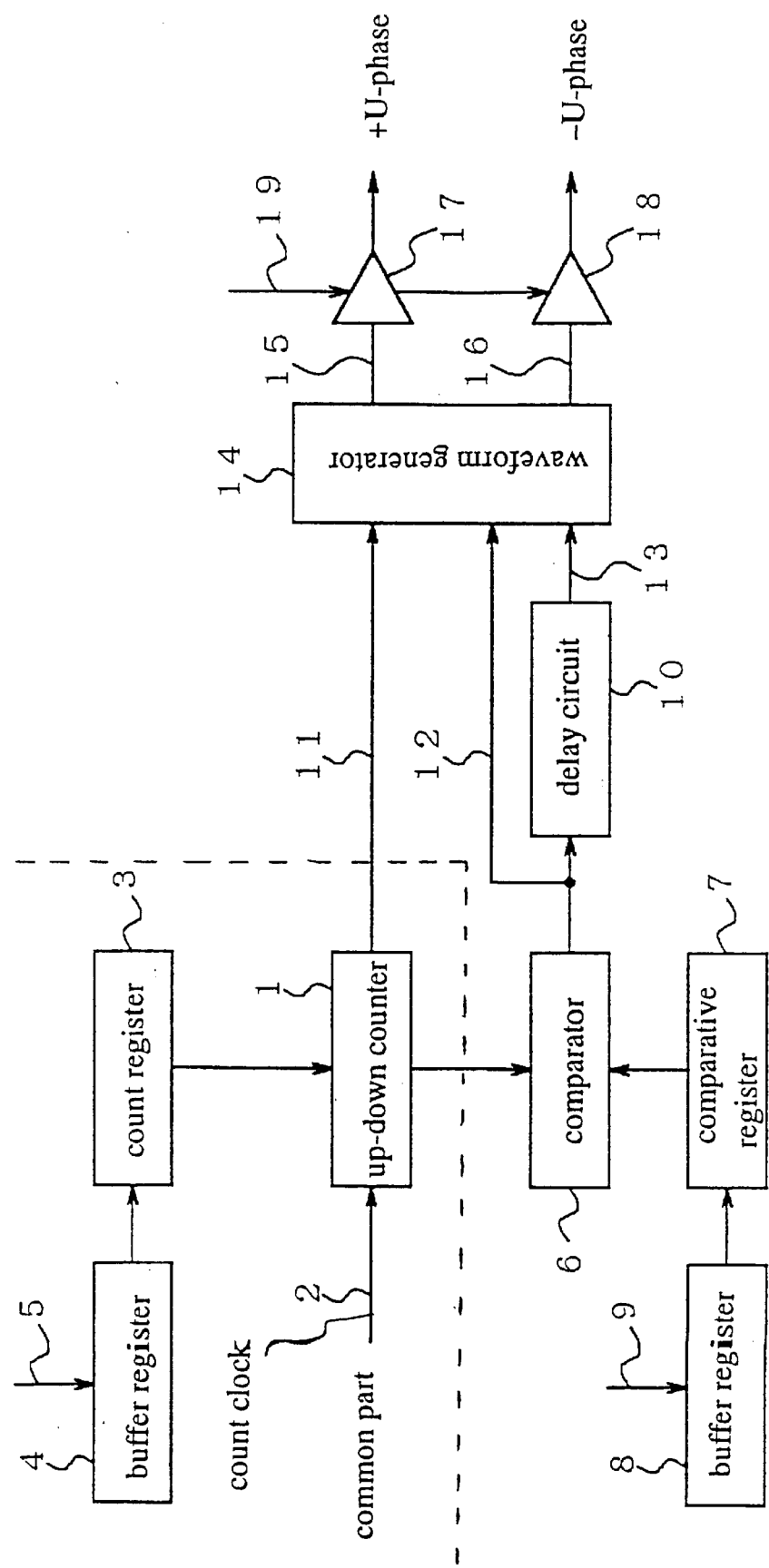
FIG. 2A is a circuit diagram illustrative of a circuit configuration of a first pulse width modulation waveform generator circuit for generating +U-phase and −U-phase pulse width modulation waveforms in a conventional three-phase pulse width modulation waveform generator.
Figure 2B:
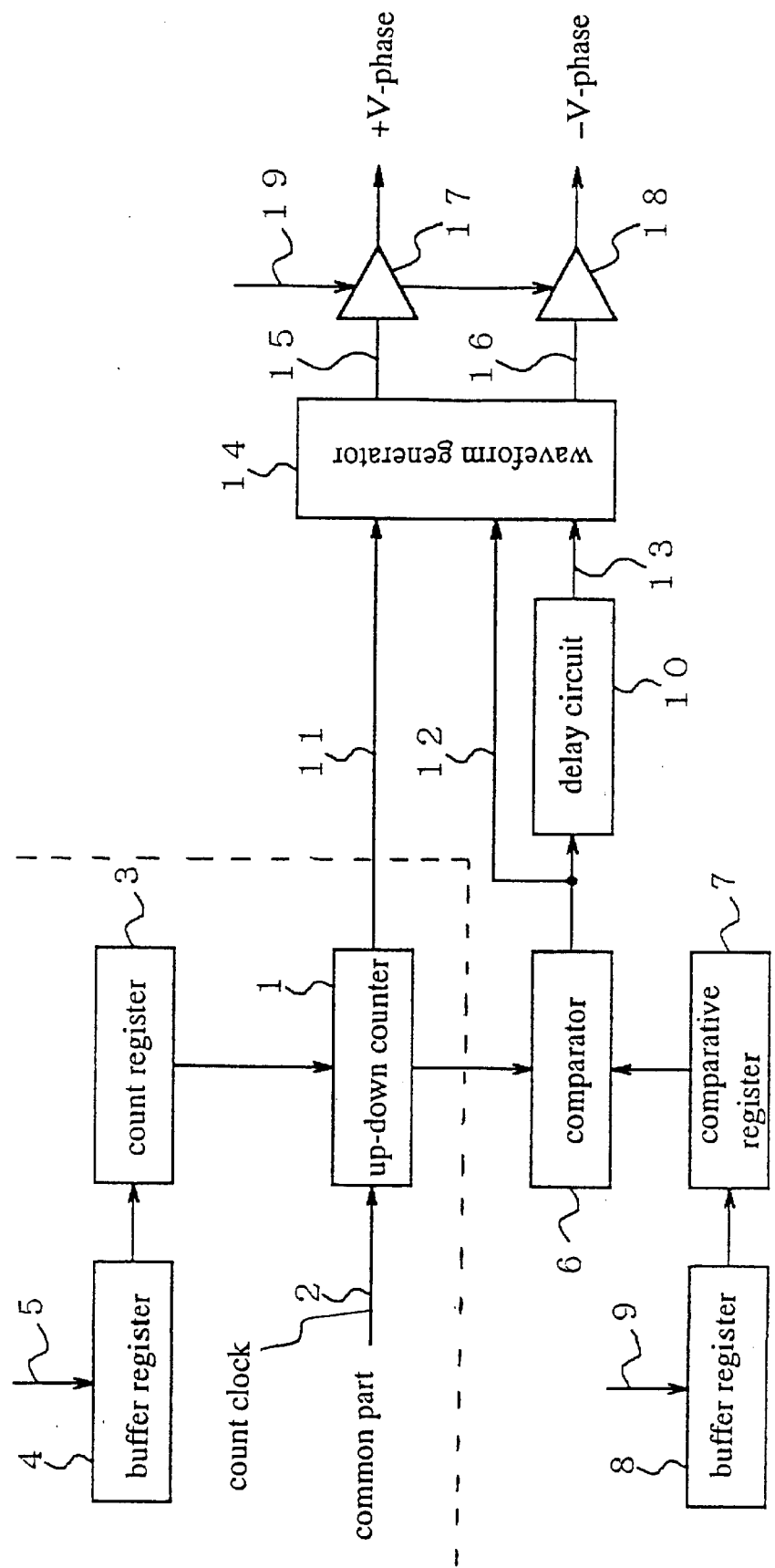
FIG. 2B is a circuit diagram illustrative of a circuit configuration of a second pulse width modulation waveform generator circuit for generating +V-phase and −V-phase pulse width modulation waveforms in the conventional three-phase pulse width modulation waveform generator.
Figure 2C:
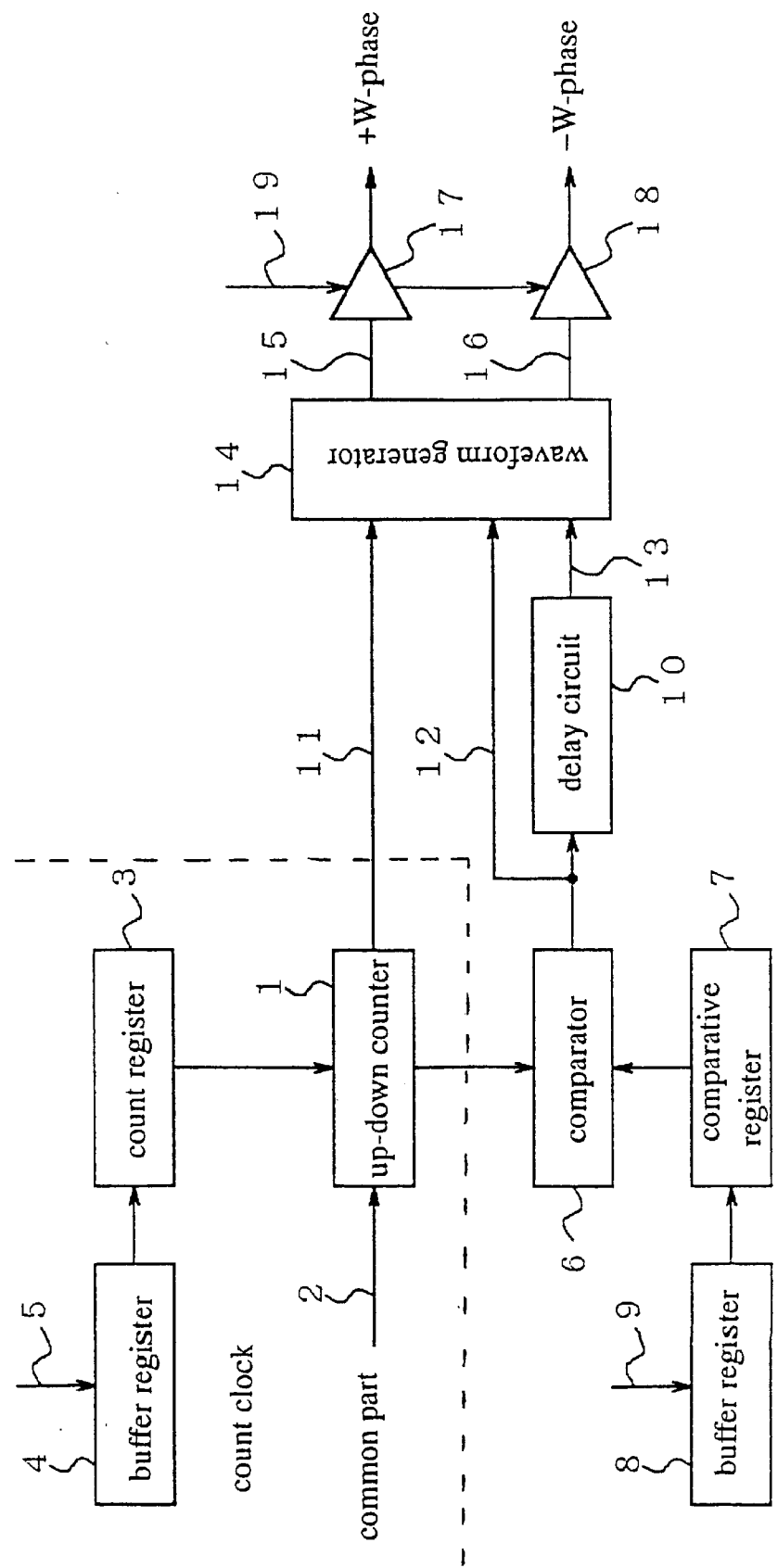
FIG. 2C is a circuit diagram illustrative of a circuit configuration of a third pulse width modulation waveform generator circuit for generating +W-phase and −W-phase pulse width modulation waveforms in the conventional three-phase pulse width modulation waveform generator.
Figure 3:
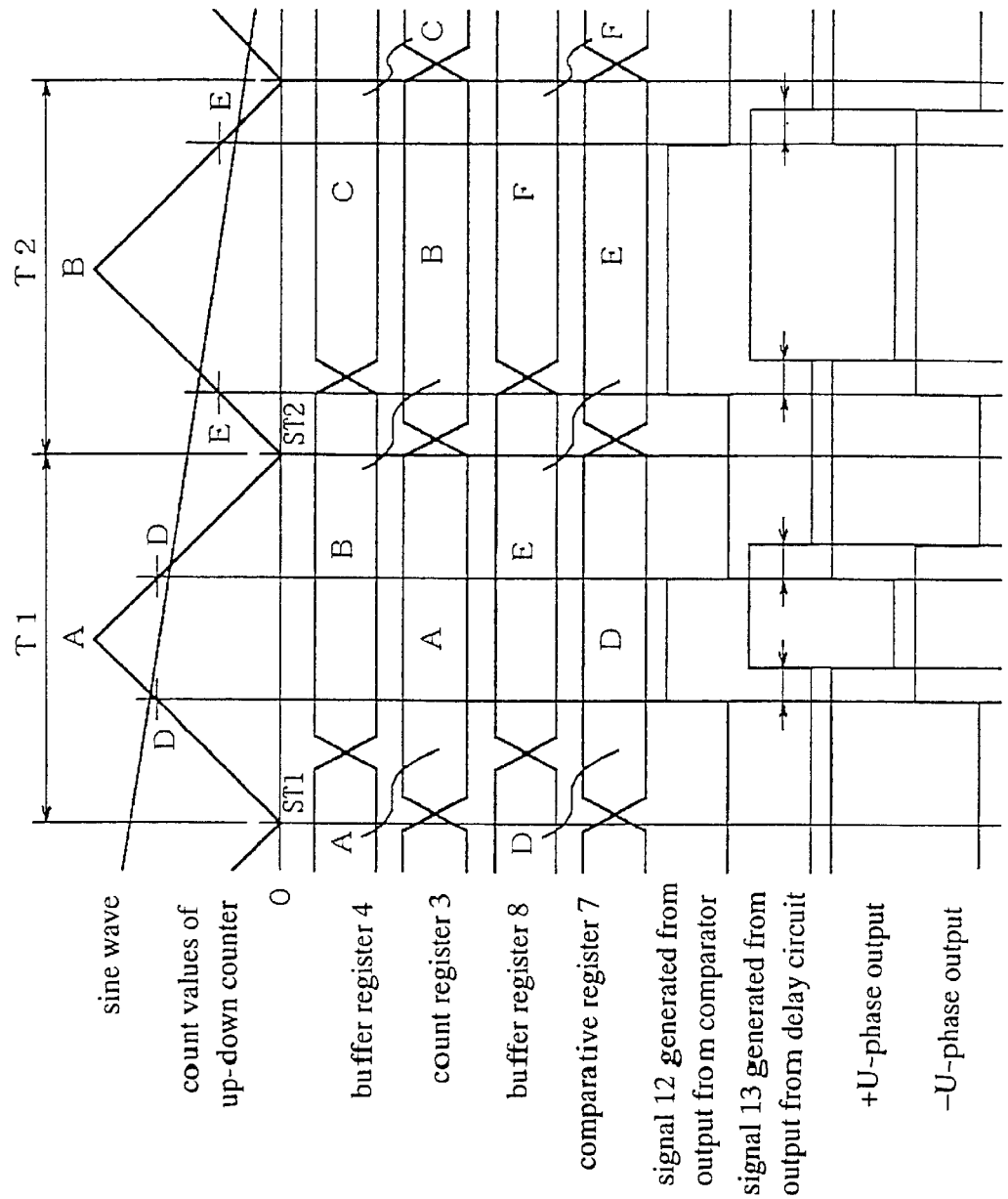
FIG. 3 is a diagram illustrative of waveforms of signals to explain operations of generating +W-phase and −W-phase pulse width modulation waveforms in the first pulse width modulation waveform generator circuit of FIG. 2A of the three-phase pulse width modulation waveform generator.
Figure 4:
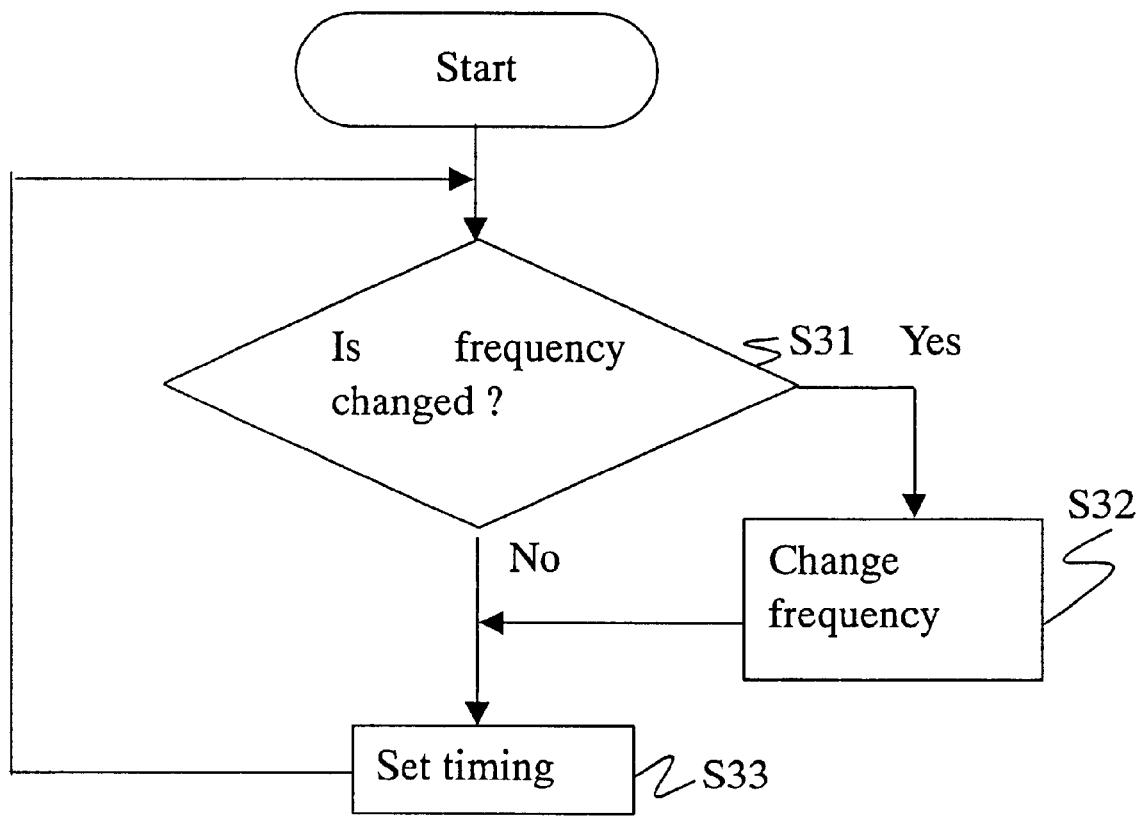
FIG. 4 is a flow chart illustrative of a pulse width modulation output process by a central processing unit.
Figure 5:
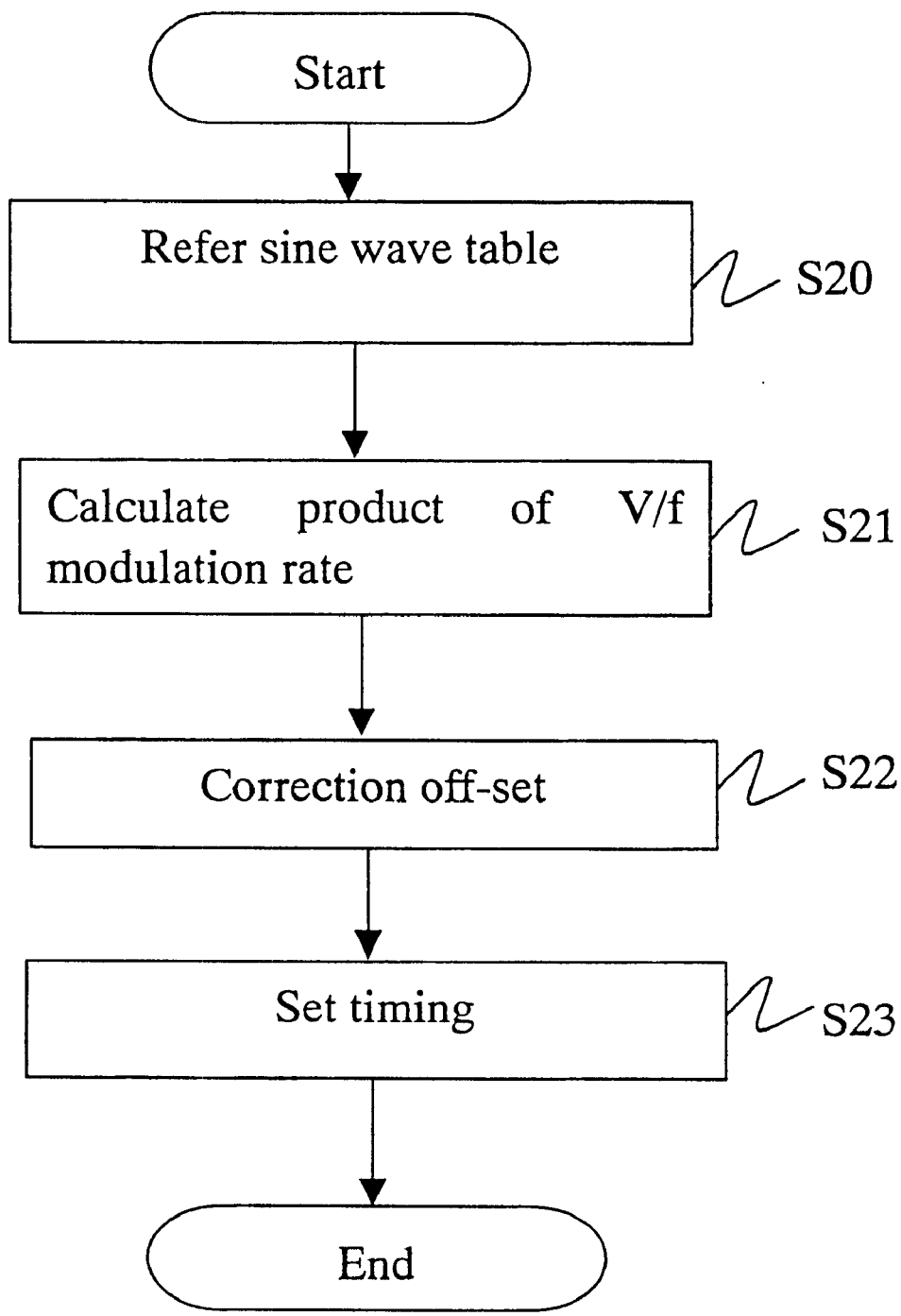
FIG. 5 is a flow chart illustrative of a timing-setting process by a central processing unit.
Figure 6:
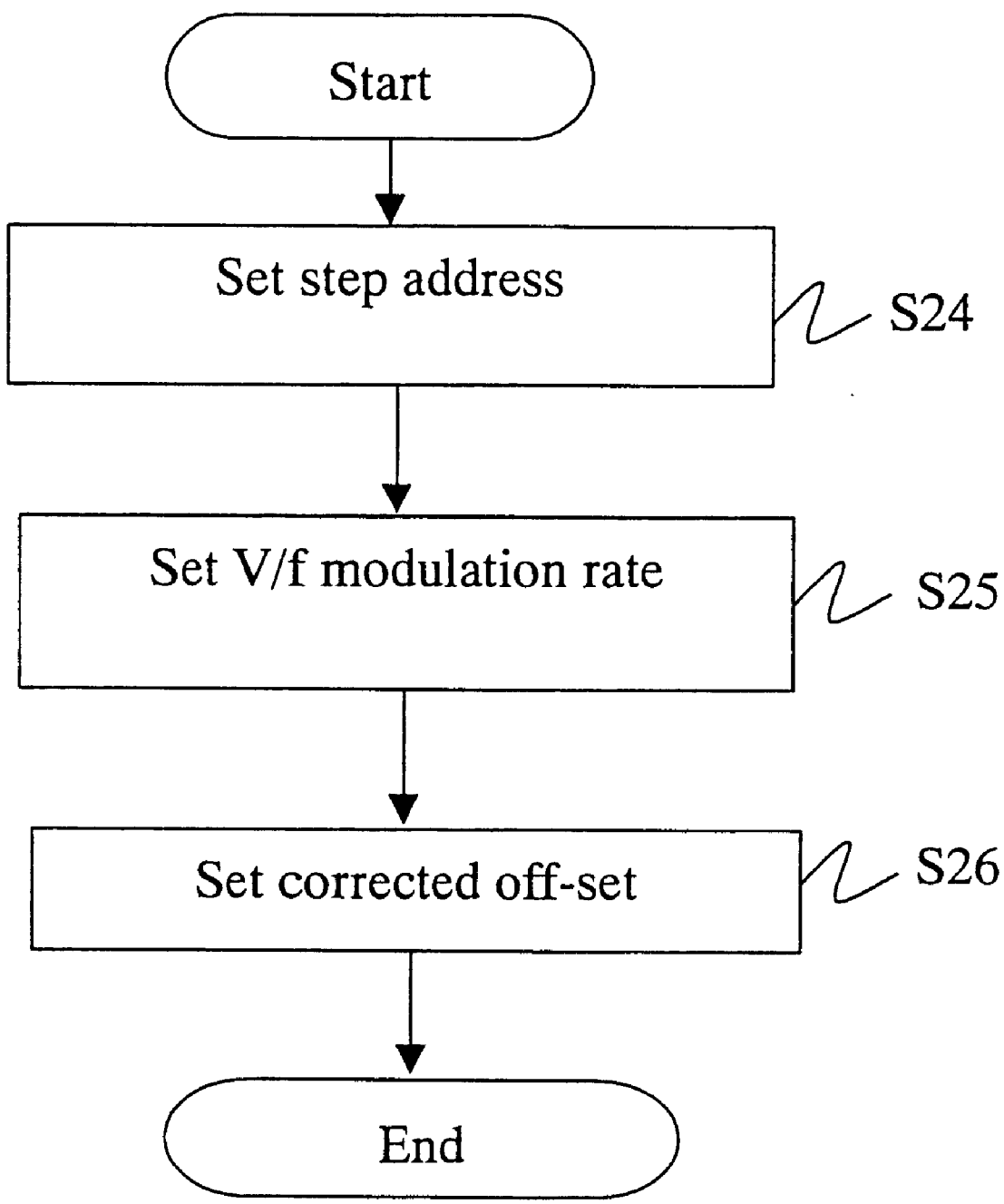
FIG. 6 is a flow chart illustrative of an output frequency change process by a central processing unit.

The first present invention provides a three-phase pulse width modulation waveform generator having at least an up-down counting circuitry which comprises: an up-down counter for performing an up-count or a down-count upon an external input of a count clock signal; and a count controller having an output side connected to an input side of the up-down counter for sending the input side of the up-down counter a count enable signal which enables the up-down counter to perform the up-count or the down-count.

It is preferable that the count controller has an input side which is connected to the up-down counter for receiving a count direction switching signal from the up-down counter, so that the count controller changes a cycle for generating the count enable signal in accordance with the count direction switching signal.

It is further preferable that the input side of the count controller the input side of the count controller receives the count clock and counts the count clock, so that if a counted value of the count clock by the count controller is made correspond to a predetermined value stared in the count controller, then the count controller generates the count enable signal.

It is further more preferable that the up-down counter generates the count direction switching signal upon receipt of a next effective input of the count clock during when the up-down counter receives the count enable signal from the count controller.

It is moreover preferable that the count controller comprises:
a clock counter receiving the count clock and counting the count clock; and a counting register for storing a registered counting value; and a comparator being connected to the counting register for receiving the registered counting value from the counting register, the comparator being also connected to the clock counter for receiving a counted value from the clock counter, the comparator being also connected to the up-down counter, and the comparator comparing the counted value to the registered counting value and transmitting a count enable signal to the up-down counter when the counted value corresponds to the registered counting value.

It is still more preferable that the count controller further comprises: an AND-logic gate having a first input terminal receiving a count direction switching monitoring signal externally inputted and a second input terminal connected to an output terminal of the comparator for receiving the count enable signal from the comparator, the AND-logic gate performing an AND-operation of a value of the count direction switching monitoring signal and a value of the count enable signal to generate a count renewal enable signal, and the AND-logic gate having an output terminal connected to the counting register for transmitting the value of the count direction switching monitoring signal to the counted register.

It is yet more preferable that the count controller further more comprises: a buffer register connected to the counting register for allowing a central processing unit to re-write a counting value and for transmitting a counting value to the counting register at the same time when the AND-logic gate generates the count renewal enable signal.

It is also preferable that the count controller comprises a buffer register connected to the counting register for allowing a central processing unit to re-write a counting value stored in the buffer register; a down-counter connected to the buffer register for receiving the counting value from the buffer register, the down-counter also receiving a count clock for counting the count clock, and the down-counter generating a count enable signal; and an AND-logic gate having a first input terminal receiving a count direction switching monitoring signal externally inputted and a second input terminal connected to an output terminal of the down-counter for receiving the count enable signal from the down-counter, the AND-logic gate performing an AND-operation of a value of the count direction switching monitoring signal and a value of the count enable signal to generate a load enable signal, and the AND-logic gate having an output terminal connected to the down-counter for transmitting the load enable signal to the down-counter.

The second present invention provides an up-down counting circuitry in a pulse width modulation waveform generator circuit. The up-down counting circuitry comprises: an up-down counter for performing an up-count or a down-count upon an external input of a count clock signal; and a count controller having an output side connected to an input side of the up-down counter for sending the input side of the up-down counter a count enable signal which enables the up-down counter to perform the up-count or the down-count.

It is also preferable that the count controller has an input side which is connected to the up-down counter for receiving a count direction switching signal from the up-down counter, so that the count controller changes a cycle for generating the count enable signal in accordance with the count direction switching signal.

It is further preferable that the input side of the count controller the input side of the count controller receives the count clock and counts the count clock, so that if a counted value of the count clock by the count controller is made correspond to a predetermined value stared in the count controller, then the count controller generates the count enable signal.

It is furthermore preferable that the up-down counter generates the count direction switching signal upon receipt of a next effective input of the count clock during when the up-down counter receives the count enable signal from the count controller.

It is moreover preferable that the count controller comprises: a clock counter receiving the count clock and counting the count clock; and a counting register for storing a registered counting value; and a comparator being connected to the counting register for receiving the registered counting value from the counting register, the comparator being also connected to the clock counter for receiving a counted value from the clock counter, the comparator being also connected to the up-down counter, and the comparator comparing the counted value to the registered counting value and transmitting a count enable signal to the up-down counter when the counted value corresponds to the registered counting value.

It is still more preferable that the count controller further comprises: an AND-logic gate having a first input terminal receiving a count direction switching monitoring signal externally inputted and a second input terminal connected to an output terminal of the comparator for receiving the count enable signal from the comparator, the AND-logic gate performing an AND-operation of a value of the count direction switching monitoring signal and a value of the count enable signal to generate a count renewal enable signal, and the AND-logic gate having an output terminal connected to the counting register for transmitting the value of the count direction switching monitoring signal to the counted register.

It is yet more preferable that the count controller further more comprises: a buffer register connected to the counting register for allowing a central processing unit to re-write a counting value and for transmitting a counting value to the counting register at the same time when the AND-logic gate generates the count renewal enable signal.

It is yet more preferable that the count controller comprises: a buffer register connected to the counting register for allowing a central processing unit to re-write a counting value stored in the buffer register; a down-counter connected to the buffer register for receiving the counting value from the buffer register, the down-counter also receiving a count clock for counting the count clock, and the down-counter generating a count enable signal; and an AND-logic gate having a first input terminal receiving a count direction switching monitoring signal externally inputted and a second input terminal connected to an output terminal of the down-counter for receiving the count enable signal from the down-counter, the AND-logic gate performing an AND-operation of a value of the count direction switching monitoring signal and a value of the count enable signal to generate a load enable signal, and the AND-logic gate having an output terminal connected to the down-counter for transmitting the load enable signal to the down-counter.

Preferred Embodiment
First Embodiment

A first embodiment according to the present invention will be described in detail with reference to the drawings. A first novel three-phase pulse width modulation waveform generator comprises a first pulse width modulation waveform generator circuit for generating +U-phase and −U-phase pulse width modulation waveforms, a second pulse width modulation waveform generator circuit for generating +V-phase and −V-phase pulse width modulation waveforms, and a third pulse width modulation waveform generator circuit for generating +W-phase and −W-phase pulse width modulation waveforms.

Figure 7A:
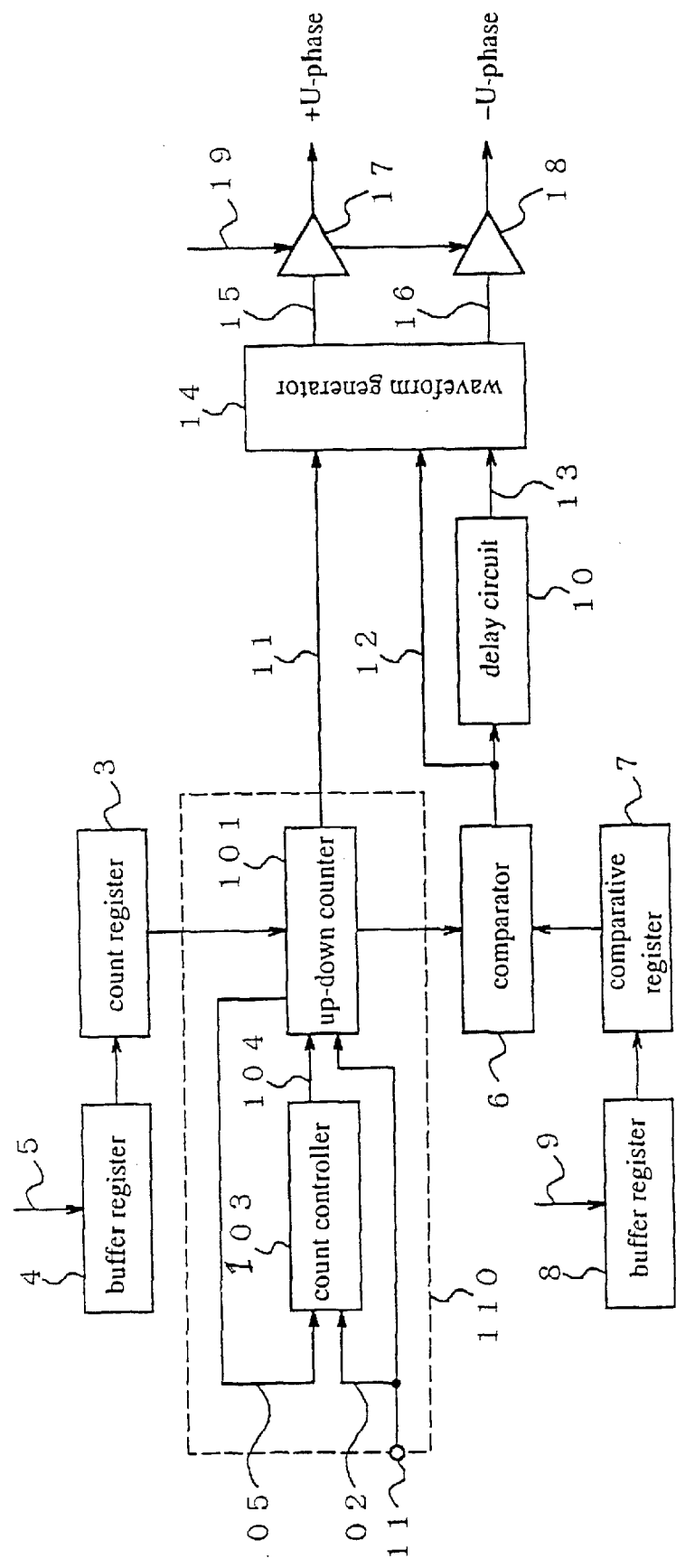
FIG. 7A is a circuit diagram illustrative of a circuit configuration of a first pulse width modulation waveform generator circuit for generating +U-phase and −U-phase pulse width modulation waveforms in the first novel three-phase pulse width modulation waveform generator in a first embodiment in accordance with the present invention.

FIG. 7A is a circuit diagram illustrative of a circuit configuration of a first pulse width modulation waveform generator circuit for generating +U-phase and −U-phase pulse width modulation waveforms in the first novel three-phase pulse width modulation waveform generator. The first pulse width modulation waveform generator circuit of the three-phase pulse width modulation waveform generator has the following circuit elements. An up-down counter 101 is provided for performing up-count and down-count. The up-down counter 101 is connected to an input terminal 111 for receiving a count clock 102 from the input terminal 111. A count controller 103 is connected to the input terminal 111 for receiving the count clock 102 from the input terminal 111. The count controller 103 is also connected to the up-down counter 101 for controlling up-count and down-count operations of the up-down counter 101. The count controller 103 generates a count enable signal 104 and transmits the count enable signal 104 to the up-down counter 101, so that the up-down counter 101 operates the up-count and down-count in accordance with the count enable signal 104 from the count controller 103. The up-down counter 101 generates a count direction switching monitoring signal 105 and transmits the count direction switching monitoring signal 105 to the count controller 103. The up-down counter 101 operates the up-count or the down-count upon input of the count clock 102 from the input terminal 111 during when the count enable signal 104 is transmitted to the up-down counter 101 from the count controller 103. The count controller 103 receives the count clock 102 for counting the same, so that the count controller 103 generates the count enable signal 104 for every counting values.

The up-down counter 101 in the down-count generates the count direction switching monitoring signal 105 which indicates the switch of the count direction, for example, form the down-count to the up-count by the next effective count clock which is the count clock inputted during the count enable signal 104 appearing. If the count clock counting value is changed, then the count controller 103 changes the generation cycle of the count enable signal 104 in synchronizing with the count direction switching monitoring signal 105.

A count register 3 is connected to the up-down counter 101 for storing a switching value and sending the switching value to the up-down counter 101 so that the up-down counter 101 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 101. A comparative register 7 is connected to the comparator 6. The comparative register 7 stores data for generating a U-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 101 for receiving one of count direction signals 11 which indicate the up-count and the down-count from the up-down counter 101. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +U-phase pulse width modulation signal 15 and a −U-phase pulse width modulation signal 16. A first three-state buffer 17 is provided which has an input terminal connected to the waveform generator 14 for receiving the +U-phase pulse width modulation signal 15 from the waveform generator 14. The first three-state buffer 17 receives an output stop signal 19, so that the first three-state buffer 17 stops the output of the +U-phase pulse width modulation signal 15. A second three-state buffer 18 is provided which has an input terminal connected to the waveform generator 14 for receiving the −U-phase pulse width modulation signal 16 from the waveform generator 14. The second three-state buffer 18 receives the output stop signal 19, so that the second three-state buffer 18 stops the output of the −U-phase pulse width modulation signal 16.

Figure 7B:
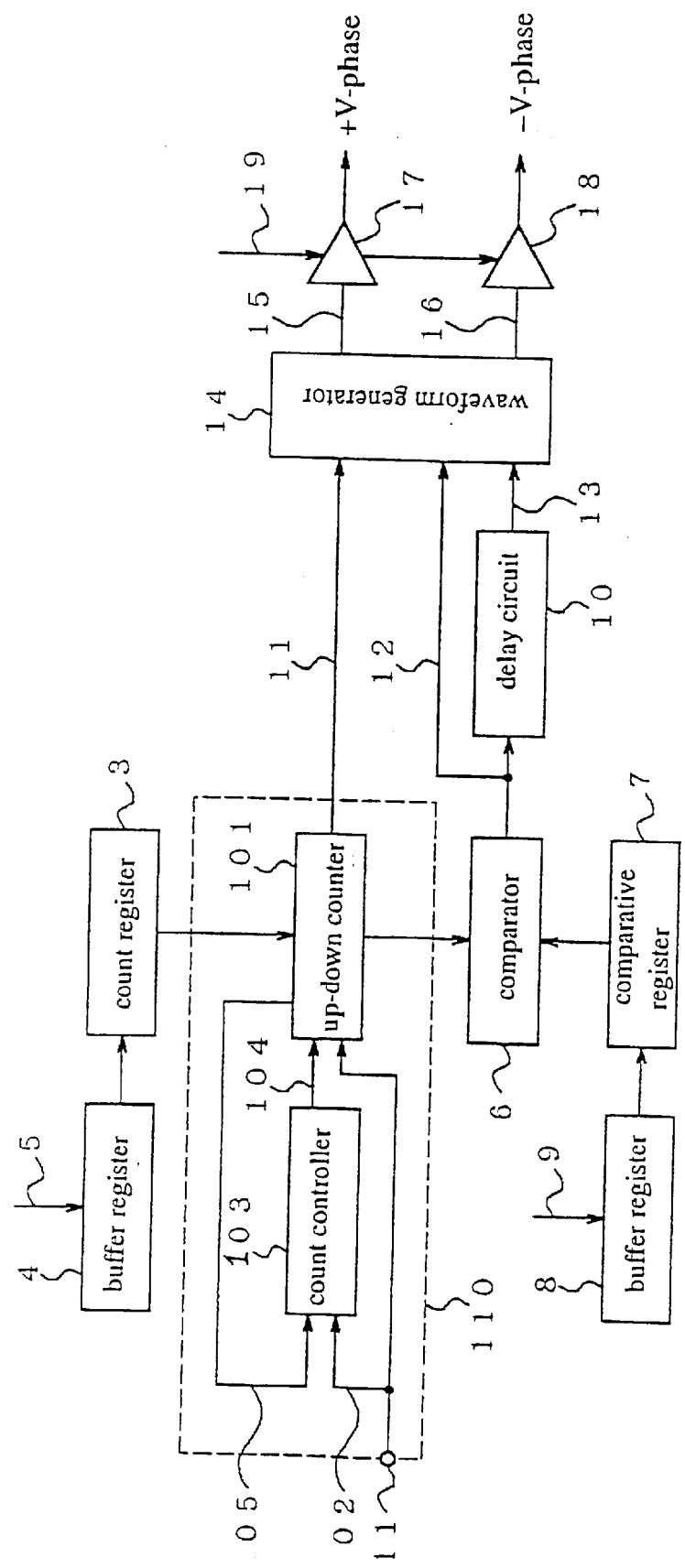
FIG. 7B is a circuit diagram illustrative of a circuit configuration of a second pulse width modulation waveform generator circuit for generating +V-phase and −V-phase pulse width modulation waveforms in the first novel three-phase pulse width modulation waveform generator in a first embodiment in accordance with the present invention.

FIG. 7B is a circuit diagram illustrative of a circuit configuration of a second pulse width modulation waveform generator circuit for generating +V-phase and −V-phase pulse width modulation waveforms in the first novel three-phase pulse width modulation waveform generator. The second pulse width modulation waveform generator circuit of the three-phase pulse width modulation waveform generator has the same circuit elements as the first pulse width modulation waveform generator circuit.

An up-down counter 101 is provided for performing up-count and down-count. The up-down counter 101 is connected to an input terminal 111 for receiving a count clock 102 from the input terminal 111. A count controller 103 is connected to the input terminal 111 for receiving the count clock 102 from the input terminal 111. The count controller 103 is also connected to the up-down counter 101 for controlling up-count and down-count operations of the up-down counter 101. The count controller 103 generates a count enable signal 104 and transmits the count enable signal 104 to the up-down counter 101, so that the up-down counter 101 operates the up-count and down-count in accordance with the count enable signal 104 from the count controller 103. The up-down counter 101 generates a count direction switching monitoring signal 105 and transmits the count direction switching monitoring signal 105 to the count controller 103. The up-down counter 101 operates the up-count or the down-count upon input of the count clock 102 from the input terminal 111 during when the count enable signal 104 is transmitted to the up-down counter 101 from the count controller 103. The count controller 103 receives the count clock 102 for counting the same, so that the count controller 103 generates the count enable signal 104 for every counting values.

The up-down counter 101 in the down-count generates the count direction switching monitoring signal 105 which indicates the switch of the count direction, for example, form the down-count to the up-count by the next effective count clock which is the count clock inputted during the count enable signal 104 appearing. If the count clock counting value is changed, then the count controller 103 changes the generation cycle of the count enable signal 104 in synchronizing with the count direction switching monitoring signal 105.

A count register 3 is connected to the up-down counter 101 for storing a switching value and sending the switching value to the up-down counter 101 so that the up-down counter 101 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 101. A comparative register 7 is connected to the comparator 6. The comparative register 7 stores data for generating a V-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 101 for receiving one of count direction signals 11 which indicate the up-count and the down-count from the up-down counter 101. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +V-phase pulse width modulation signal 15 and a −V-phase pulse width modulation signal 16. A first three-state buffer 17 is provided which has an input terminal connected to the waveform generator 14 for receiving the +V-phase pulse width modulation signal 15 from the waveform generator 14. The first three-state buffer 17 receives an output stop signal 19, so that the first three-state buffer 17 stops the output of the +V-phase pulse width modulation signal 15. A second three-state buffer 18 is provided which has an input terminal connected to the waveform generator 14 for receiving the −V-phase pulse width modulation signal 16 from the waveform generator 14. The second three-state buffer 18 receives the output stop signal 19, so that the second three-state buffer 18 stops the output of the −V-phase pulse width modulation signal 16.

Figure 7C:
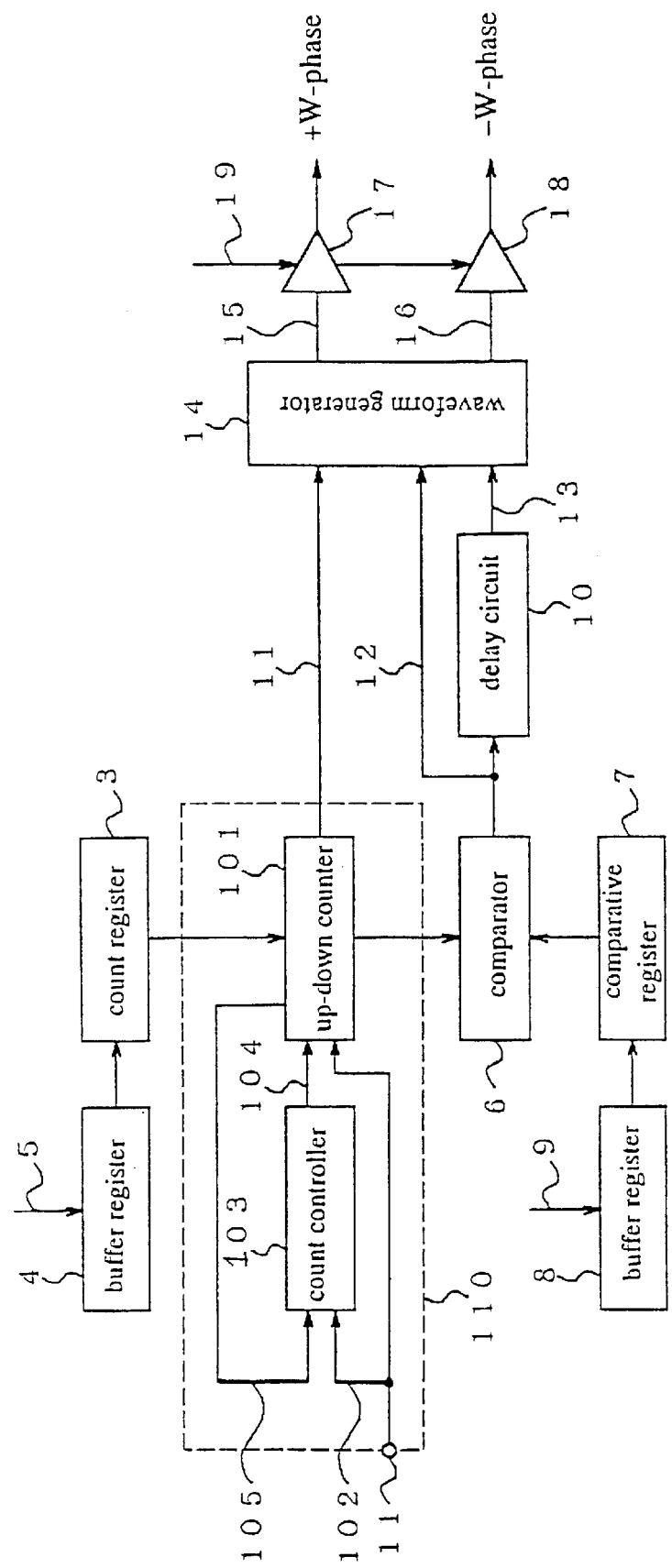
FIG. 7C is a circuit diagram illustrative of a circuit configuration of a third pulse width modulation waveform generator circuit for generating +W-phase and −W-phase pulse width modulation waveforms in the first novel three-phase pulse width modulation waveform generator in a first embodiment in accordance with the present invention.

FIG. 7C is a circuit diagram illustrative of a circuit configuration of a third pulse width modulation waveform generator circuit for generating +W-phase and −W-phase pulse width modulation waveforms in the first novel three-phase pulse width modulation waveform generator. The third pulse width modulation waveform generator circuit of the three-phase pulse width modulation waveform generator has the same circuit elements as the first pulse width modulation waveform generator circuit.

An up-down counter 101 is provided for performing up-count and down-count. The up-down counter 101 is connected to an input terminal 111 for receiving a count clock 102 from the input terminal 111. A count controller 103 is connected to the input terminal 111 for receiving the count clock 102 from the input terminal 111. The count controller 103 is also connected to the up-down counter 101 for controlling up-count and down-count operations of the up-down counter 101. The count controller 103 generates a count enable signal 104 and transmits the count enable signal 104 to the up-down counter 101, so that the up-down counter 101 operates the up-count and down-count in accordance with the count enable signal 104 from the count controller 103. The up-down counter 101 generates a count direction switching monitoring signal 105 and transmits the count direction switching monitoring signal 105 to the count controller 103. The up-down counter 101 operates the up-count or the down-count upon input of the count clock 102 from the input terminal 111 during when the count enable signal 104 is transmitted to the up-down counter 101 from the count controller 103. The count controller 103 receives the count clock 102 for counting the same, so that the count controller 103 generates the count enable signal 104 for every counting values.

The up-down counter 101 in the down-count generates the count direction switching monitoring signal 105 which indicates the switch of the count direction, for example, form the down-count to the up-count by the next effective count clock which is the count clock inputted during the count enable signal 104 appearing. If the count clock counting value is changed, then the count controller 103 changes the generation cycle of the count enable signal 104 in synchronizing with the count direction switching monitoring signal 105.

A count register 3 is connected to the up-down counter 101 for storing a switching value and sending the switching value to the up-down counter 101 so that the up-down counter 101 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 101. A comparative register 7 is connected to the comparator 6. The comparative register 7 stores data for generating a W-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 101 for receiving one of count direction signals 11 which indicate the up-count and the down-count from the up-down counter 1. The waveform generator 14 is also connected to the comparator 6 for receiving a correspondence-detected signal 12 from the comparator 6.

The waveform generator 14 is also connected to the delay circuit 10 for receiving a delay signal from the delay circuit 10. The waveform generator 14 generates an +W-phase pulse width modulation signal 15 and a −W-phase pulse width modulation signal 16. A first three-state buffer 17 is provided which has an input terminal connected to the waveform generator 14 for receiving the +W-phase pulse width modulation signal 15 from the waveform generator 14. The first three-state buffer 17 receives an output stop signal 19, so that the first three-state buffer 17 stops the output of the +W-phase pulse width modulation signal 15. A second three-state buffer 18 is provided which has an input terminal connected to the waveform generator 14 for receiving the −W-phase pulse width modulation signal 16 from the waveform generator 14. The second three-state buffer 18 receives the output stop signal 19, so that the second three-state buffer 18 stops the output of the −W-phase pulse width modulation signal 16.

As described above, the first, second and third pulse width modulation waveform generator circuits of the above first novel three-phase pulse width modulation waveform generator have the same circuit configuration as each other, provided that the up-down counter 101, the count controller 103, the count resistor 3 and the buffer resistor 4 are commonly provided to the first, second and third pulse width modulation waveform generator circuits, for which reason the following descriptions will be made by taking the first pulse width modulation waveform generator circuit as one example.

Figure 8:
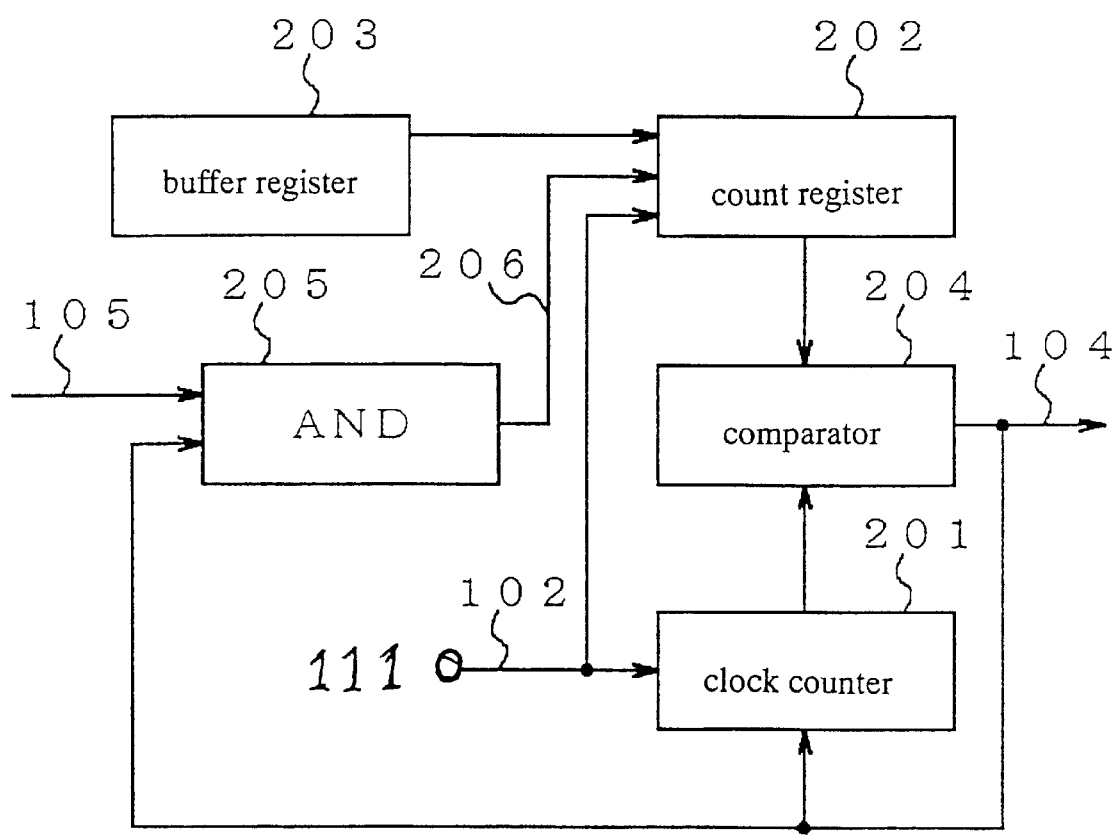
FIG. 8 is a circuit diagram illustrative of a circuit configuration of a count controller in each of the first, second and third pulse width modulation waveform generator circuits of the above first novel three-phase pulse width modulation waveform generator shown in FIGS. 7A, 7B and 7C in a first embodiment in accordance with the present invention.

FIG. 8 is a circuit diagram illustrative of a circuit configuration of a count controller in each of the first, second and third pulse width modulation waveform generator circuits of the above first novel three-phase pulse width modulation waveform generator shown in FIGS. 7A, 7B and 7C. The count controller 103 has the following circuit elements. A clock counter 201 is provided which is connected to the input terminal 111 for receiving the count clock 102 from the input terminal 111, so that the clock counter 201 counts the count clock 102. A counting register 202 is also provided which is connected to the input terminal 111 for receiving the count clock 102 from the input terminal 111. A buffer register 203 is also provided for storing a counting value which is written by the central processing unit. The buffer register 203 is connected to the counting register 202 so that the buffer register 203 transmits the counting value to the counting register 202. A comparator 204 is provided which is connected to the counting register 202 for receiving the registered counting value from the counting register 202 and also connected to the clock counter 201 for receiving the counted value from the clock counter 201, so that the comparator 204 compares the counted value from the clock counter 201 to the registered counting value from the counting register 202. If the counted value from the clock counter 201 corresponds to the registered counting value from the counting register 202, then the comparator 204 generates the count enable signal 104. The count enable signal is transmitted to the above up-down counter 101. The AND-logic circuit 205 is further provided. A first input terminal of the AND-logic circuit 205 is connected to the up-down counter 101 for receiving the count direction switching monitoring signal 105 from the up-down counter 101. A second input terminal of the AND-logic circuit 205 is also connected to the comparator 204 for receiving the count enable signal 104 from the comparator 204. An output terminal of the AND-logic circuit 205 is also connected to the counting register 202. The AND-logic circuit 205 performs an AND-operation of the count enable signal 104 and the count direction switching monitoring signal 105 so that the AND-logic circuit 205 generates a counting renewal enable signal 206 and transmits the counting renewal enable signal 206 to the counting register 202, whereby the counting register 202 renews the registered counting value.

Figure 9:
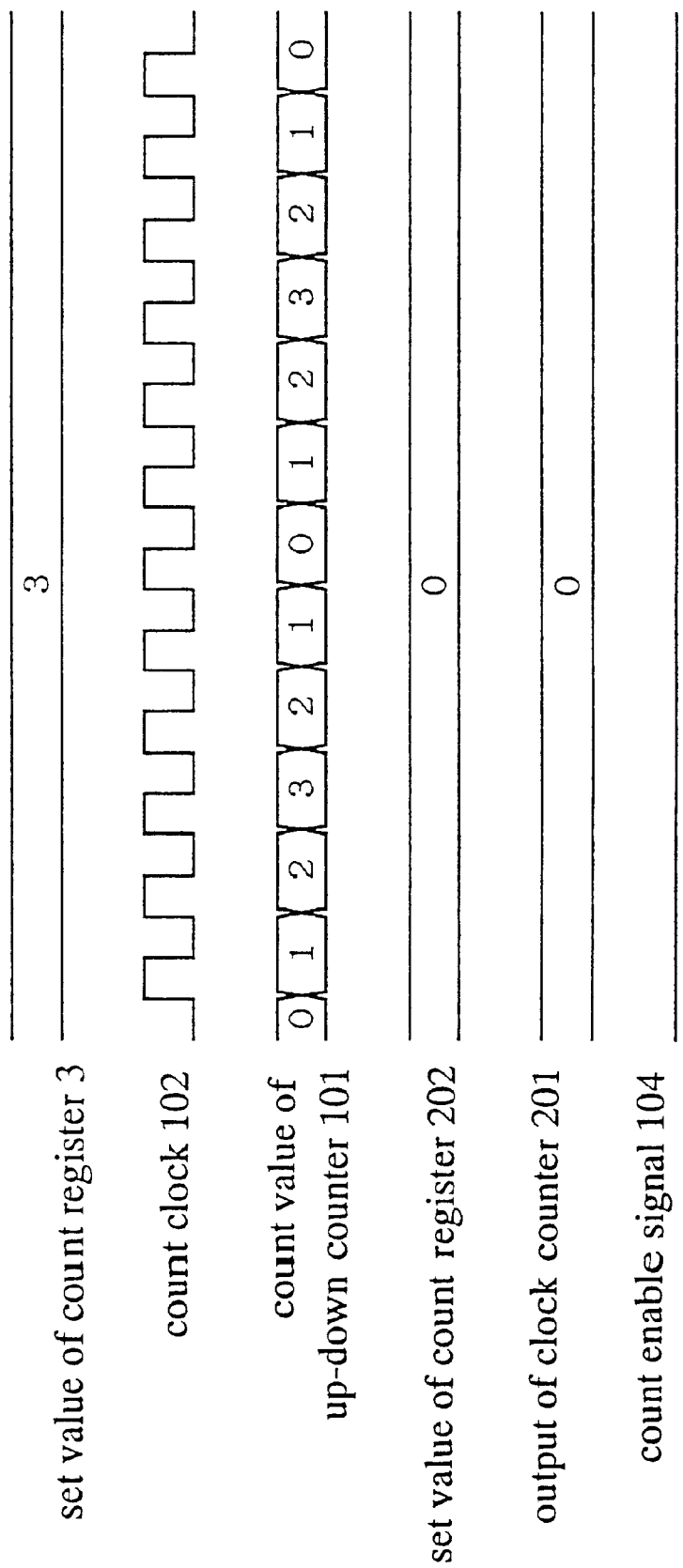
FIG. 9 is a timing chart illustrative of waveforms of a setting value of the count register, a count clock, a setting value of the counting register, an output value from the clock counter, and the count enable signal, wherein the counting value is set to be 0 in a first embodiment in accordance with the present invention.
Figure 10:
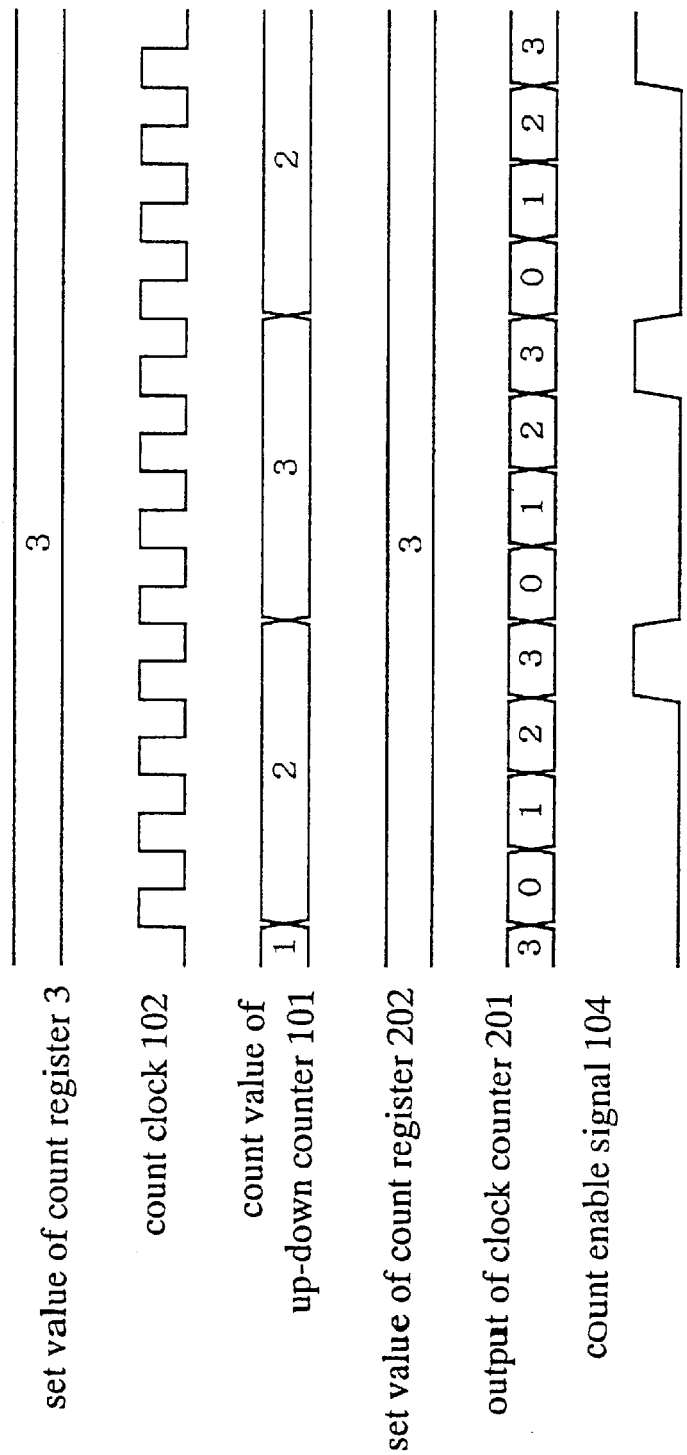
FIG. 10 is a timing chart illustrative of waveforms of a setting value of the count register, a count clock, a setting value of the counting register, an output value from the clock counter, and the count enable signal, wherein the counting value is set to be 3 in a first embodiment in accordance with the present invention.
Figure 11:
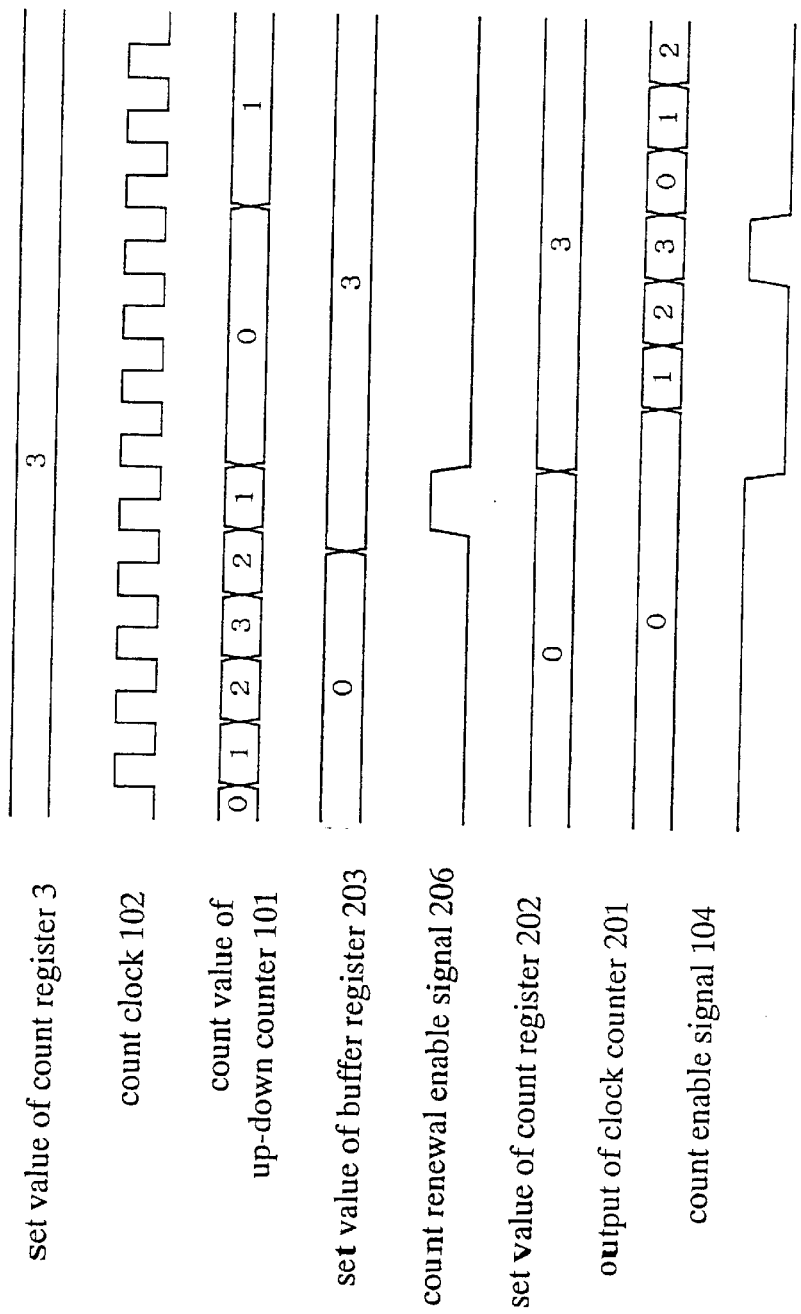
FIG. 11 is a timing chart illustrative of waveforms of a setting value of the count register, a count clock, a setting value of the counting register, an output value from the clock counter, and the count enable signal, wherein the counting value is changed from 0 to 3 in a first embodiment in accordance with the present invention.
Figure 12:
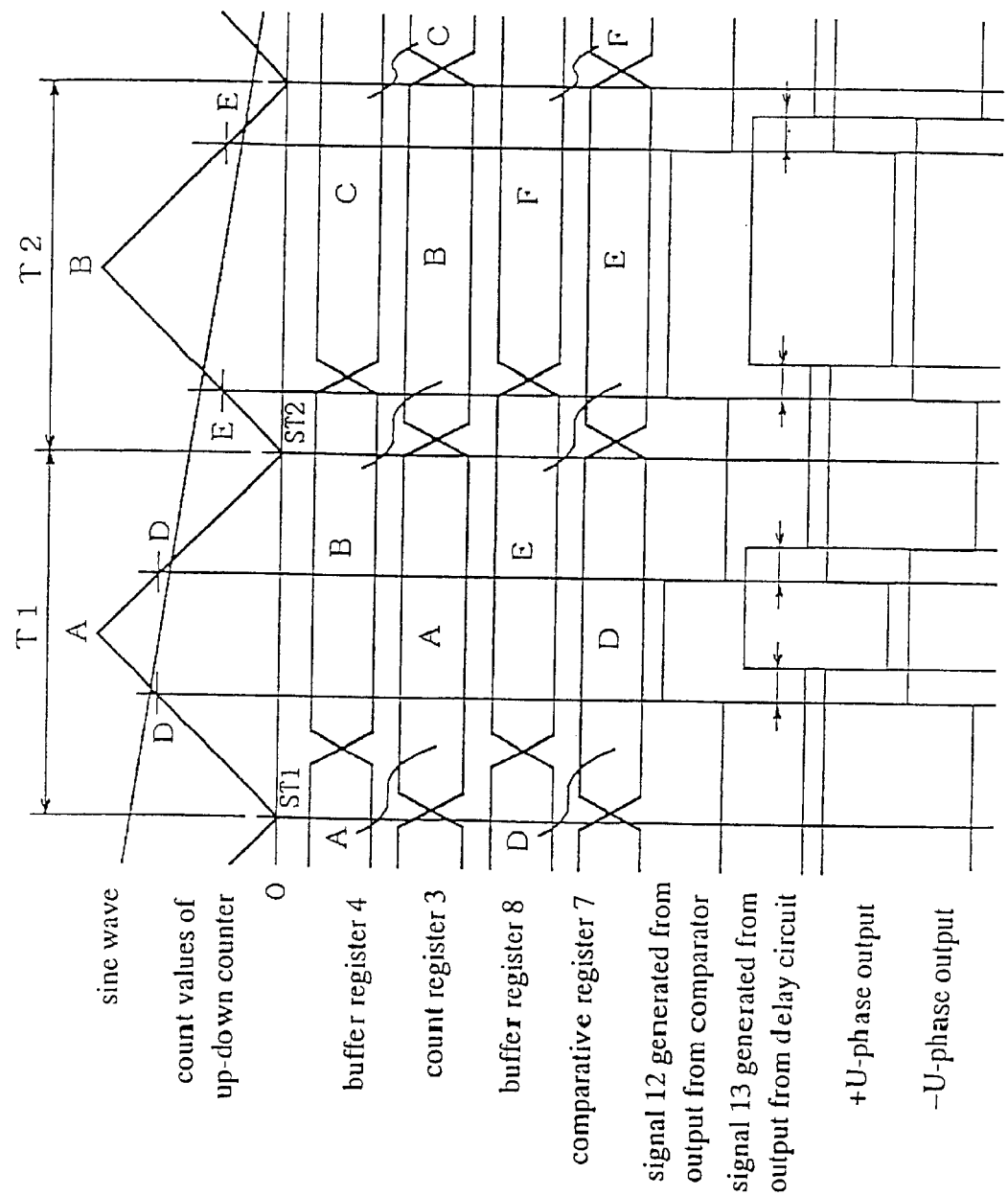
FIG. 12 is a timing chart illustrative of waveforms of a sine wave, a counting value of he up-down counter, a value of the first buffer register, a value of the count register, a value of the second buffer register, a value of the comparative register, a signal generated form the output from the comparator, a signal generated form the output from the delay circuit, a +U-phase output and a −U-phase output in a first embodiment in accordance with the present invention.

The following descriptions will focus on operations of the first novel three-phase pulse width modulation waveform generator in this embodiment. Operations of the up-down counter 101 and the count controller 103 will subsequently be described with reference to FIGS. 9, 10, 11 and 12. FIG. 9 is a timing chart illustrative of waveforms of a setting value of the count register, a count clock, a setting value of the counting register, an output value from the clock counter, and the count enable signal, wherein the counting value is set to be 0. FIG. 10 is a timing chart illustrative of waveforms of a setting value of the count register, a count clock, a setting value of the counting register, an output value from the clock counter, and the count enable signal, wherein the counting value is set to be 3. FIG. 11 is a timing chart illustrative of waveforms of a setting value of the count register, a count clock, a setting value of the counting register, an output value from the clock counter, and the count enable signal, wherein the counting value is changed from 0 to 3. FIG. 12 is a timing chart illustrative of waveforms of a sine wave, a counting value of he up-down counter, a value of the first buffer register, a value of the count register, a value of the second buffer register, a value of the comparative register, a signal generated form the output from the comparator, a signal generated form the output from the delay circuit, a +U-phase output and a −U-phase output.

The clock counter 201 counts the inputted count clock 201. The counted value counted by the clock counter 201 is transmitted to the comparator 204. The counting register 202 also transmits the registered counting value to the comparator 204. The comparator 204 compares the counted value from the clock counter 201 with the registered counting value from the counting register 202. If the counted value from the clock counter 201 corresponds to the registered counting value from the counting register 202, then the comparator 204 generates the count enable signal 104. The count enable signal 104 is transmitted to the up-down counter 101 so that the up-down counter 101 performs the up-count operation or the down-count operation upon receipt of the count clocks.

The clock counter 201 is initialized by the next count clock 102 before the clock counter 201 starts to count the inputted count clock 102. The counting value set in the buffer register 203 is transmitted to the counting register 202 upon input of the count clock 102 when generating the counting renewal enable signal 206.

Operations other than the count controller 103 will be described with reference to FIG. 12. FIG. 12 is a timing chart when the zero-detecting signal of the up-down counter 101 is used for the first and second transfer enable signals 5 and 9.

The up-down counter 101 operates at a first time period T1 and a second time period T2 which correspond to the carrier cycle of the triangle wave modulation. Data "A" to be used for determining the first time period. T1 of the up-down counter 101 is transmitted from the buffer register 4 to the count register 3 at a first start time ST1 of the first time period T1, so that the up-down counter 101 switches from the up-count to the down-count on the basis of the data "A".

Further, data "B" to be used for determining the second time period T2 of the up-down counter 101 is transmitted from the buffer register 4 to the count register 3 at a second start time ST2 of the second time period T2, so that the up-down counter 101 switches from the up-count to the down-count on the basis of the data "B".

Data "D" are comparative data for generating +U-phase pulse width modulation output signal and −U-phase pulse width modulation output signal in the first time period T1. The data "D" are transmitted from the buffer register 8 to the comparative register 7 at the first start time ST1 of the first time period T1. The comparative register 7 transmits the data "D" to the comparator 6. The up-down counter 101 also transmits the counted value to the comparator 6. The comparator 6 compares the counted value from the up-down counter 101 to the data "D" from the comparative register 7, so that if the counted value from the up-down counter 101 corresponds to the data "D" from the comparative register 7, then the comparator 6 generates the correspondence-detected signal 12, based upon which the +U-phase pulse width modulation output signal and −U-phase pulse width modulation output signal are generated by the waveform generator 14.

Data "E" are comparative data for generating +U-phase pulse width modulation output signal and −U-phase pulse width modulation output signal in the second time period T2. The data "E" are transmitted from the buffer register 8 to the comparative register 7 at the second start time ST2 of the second time period T2. The comparative register 7 transmits the data "E" to the comparator 6. The up-down counter 101 also transmits the counted value to the comparator 6. The comparator 6 compares the counted value from the up-down counter 101 to the data "E" from the comparative register 7, so that if the counted value from the up-down counter 101 corresponds to the data "E" from the comparative register 7, then the comparator 6 generates the correspondence-detected signal 12, based upon which the +U-phase pulse width modulation output signal and −U-phase pulse width modulation output signal are generated by the waveform generator 14.

Namely, the data set in the first and second buffer registers 4 and 8 are transmitted to the count register 3 and the comparative register 7 respectively upon zero-detection of the up-down counter 101. The up-down counter 101 perform the up-counting or down-counting operation upon input of the count clock 102 during when the up-down counter 101 receives the count enable signal 104 from the count controller 103. If the counted value by the up-counting operation of the up-down counter 101 reaches the upper limit value set in the count register 3, then the up-down counter 101 switches from the up-count to the down-count. If the counted value by the down-counting operation of the up-down counter 101 reaches the lower limit value "0" set in the count register 3, then the up-down counter 101 switches from the down-count to the up-count.

If the counted value from the up-down counter 101 corresponds to the data for generating the U-phase pulse width modulation signals from the comparative register 7, then the comparator 6 generates the correspondence-detected signal 12 and transmits the correspondence-detected signal 12 both the delay circuit 10 and the waveform generator 14. The waveform generator 14 receives the count direction signal 11 which indicate the up-count and the down-count from the up-down counter 1. The waveform generator 14 also receives the correspondence-detected signal 12 from the comparator 6. The waveform generator 14 also receives a delay signal from the delay circuit 10. The waveform generator 14 generates a +U-phase pulse width modulation signal 15 and a −U-phase pulse width modulation signal 16. The first three-state buffer 17 receives the +U-phase pulse width modulation signal 15 from the waveform generator 14. The first three-state buffer 17 also receives the output stop signal 19, so that the first three-state buffer 17 stops the output of the +U-phase pulse width modulation signal 15. The second three-state buffer 18 receives the −U-phase pulse width modulation signal 16 from the waveform generator 14. The second three-state buffer 18 also receives the output stop signal 19, so that the second three-state buffer 18 stops the output of the −U-phase pulse width modulation signal 16.

Figure 13:
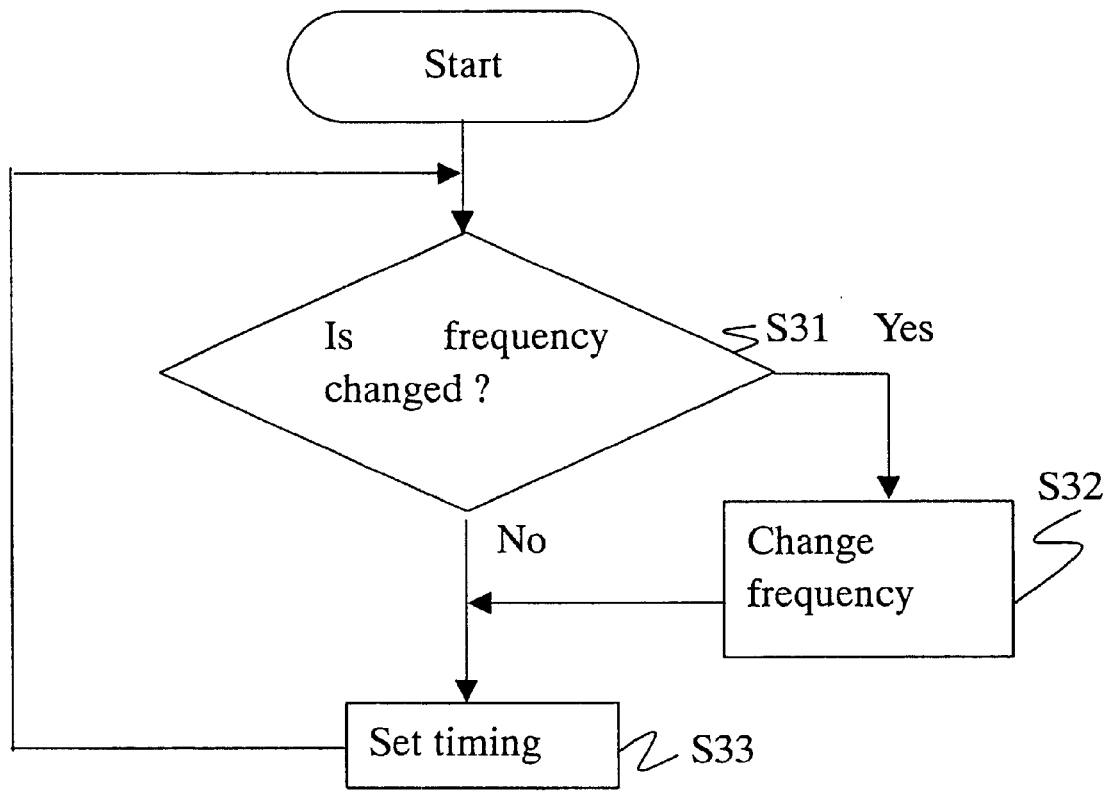
FIG. 13 is a flow chart illustrative of a pulse width modulation output process by a central processing unit in a first embodiment in accordance with the present invention.

FIG. 13 is a flow chart illustrative of a pulse width modulation output process by a central processing unit. The pulse width modulation output process is made as follows. In the first step S31, it is verified that the frequency change is required. If required, in the second step S32, the frequency is changed, before in the third step S33, the timing is set. If not required, in the third step S33, the timing-setting process is carried out as shown in FIG. 14.

Figure 14:
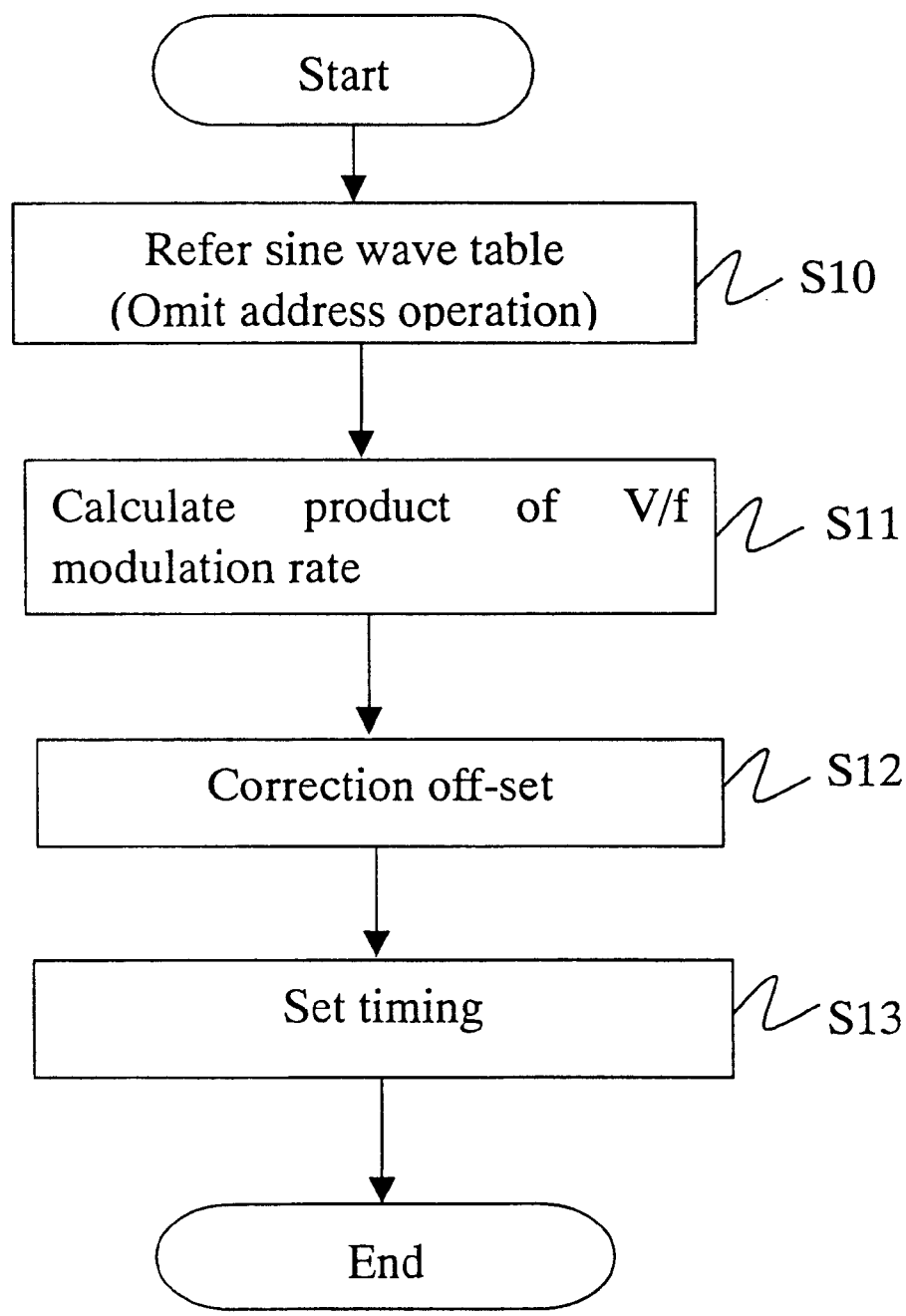
FIG. 14 is a flow chart illustrative of a timing-setting process by a central processing unit in a first embodiment in accordance with the present invention.

FIG. 14 is a flow chart illustrative of a timing-setting process by a central processing unit. The timing-setting process is carried out as follows. In a first step S10, a sine wave table is referred to obtain data without, however, calculating an address to be referred on the basis of a step address which has been previously set in accordance with the output frequency. In a second step S11, a product of the V/f modulation rate is calculated to obtain timing data, wherein the V/f modulation rate has previously been set. In a third step S12, an off-set correction is made on the basis of the off-set correction value which has previously been set. In a fourth step S13, a timing is set by setting the timing data to the buffer registers of the first, second and third pulse width modulation waveform generator circuits of the three-phase pulse width modulation waveform generator.

Figure 15:
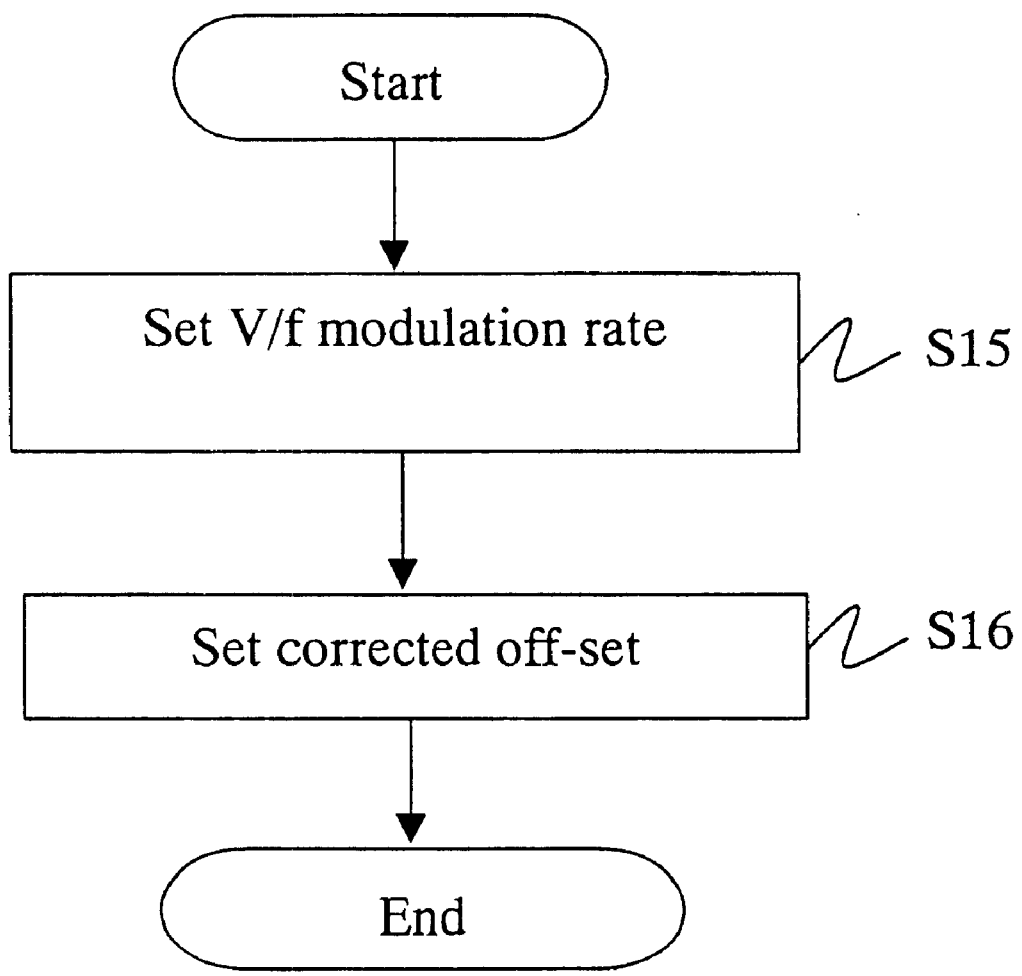
FIG. 15 is a flow chart illustrative of an output frequency change process by a central processing unit in a first embodiment in accordance with the present invention.

FIG. 15 is a flow chart illustrative of an output frequency change process by a central processing unit. In a first step S15, the V/f modulation rate is set. In a second step S16, an off-set correction value is set. It is unnecessary to set the step address.

Figure 16:
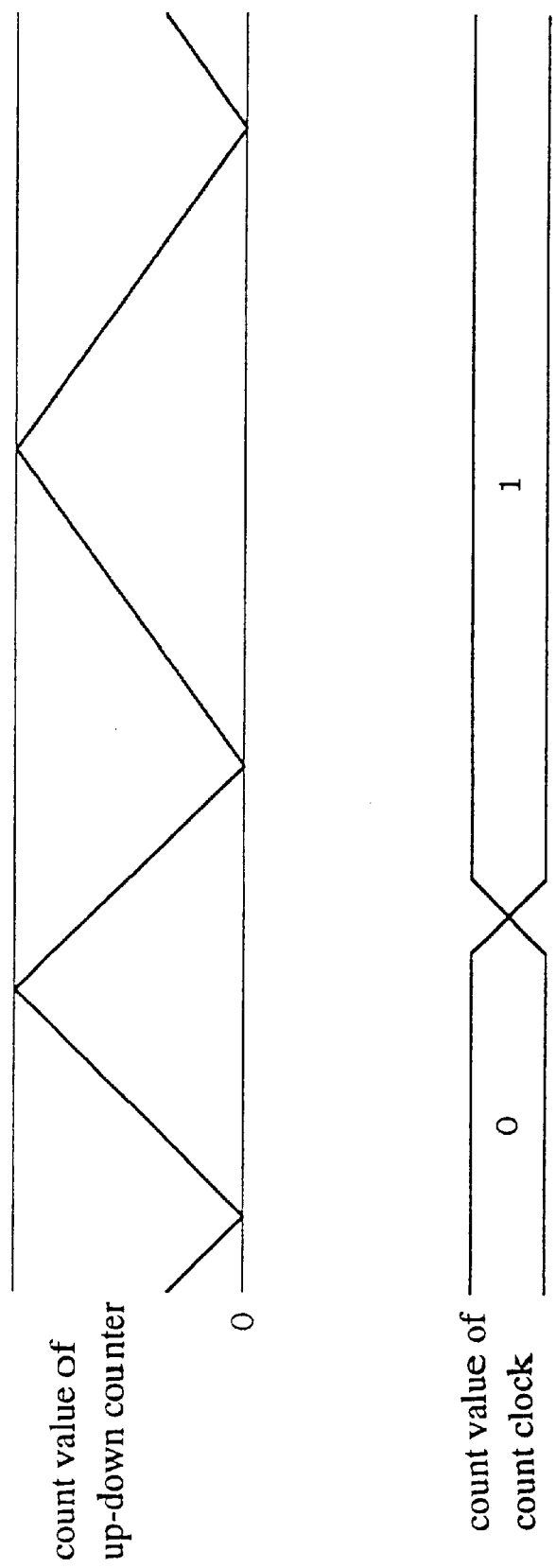
FIG. 16 is a time chart illustrative of another waveforms of a count value of an up-down counter and a counted value of the count clock in the first embodiment in accordance with the present invention.

FIG. 16 is a time chart illustrative of another waveforms of a count value of an up-down counter and a counted value of the count clock. It is possible to modify the operations of the above first novel three-phase pulse width modulation waveform generator as shown in FIG. 16.

The above first novel three-phase pulse width modulation waveform generator is capable of reducing the load to the central processing unit in generating the three-phase pulse width modulation waveforms.

The above first novel three-phase pulse width modulation waveform generator is capable of reducing the load to the central processing unit in the process for changing the output frequency in order to generate the three-phase pulse width modulation waveforms.

The above first novel three-phase pulse width modulation waveform generator is capable of changing carrier cycles by switching count cycles of an up-down counter, which serve as a base for the carrier frequency, wherein the switch is made without discontinuation of the counting operation of the up-down counter.

The above first novel three-phase pulse width modulation waveform generator allows that a sine wave data group on a sine wave table has been referred prior to changing the carrier cycle, before this sine wave data group is utilized as another sine wave data group for a different output frequency, whereby it is unnecessary to calculate a table address in correspondence with the output frequency in referring the sine wave table.

The above first novel three-phase pulse width modulation waveform generator allows that a sine wave data group on a sine wave table has been referred prior to changing the carrier cycle, before this sine wave data group is utilized as another sine wave data group for a different output frequency, whereby it is unnecessary to calculate a step address to be used for operation for the table address.

Second Embodiment

A second embodiment according to the present invention will be described in detail with reference to the drawings. A second novel three-phase pulse width modulation waveform generator comprises a first pulse width modulation waveform generator circuit for generating +U-phase and −U-phase pulse width modulation waveforms, a second pulse width modulation waveform generator circuit for generating +V-phase and −V-phase pulse width modulation waveforms, and a third pulse width modulation waveform generator circuit for generating +W-phase and −W-phase pulse width modulation waveforms.

Figure 17A:
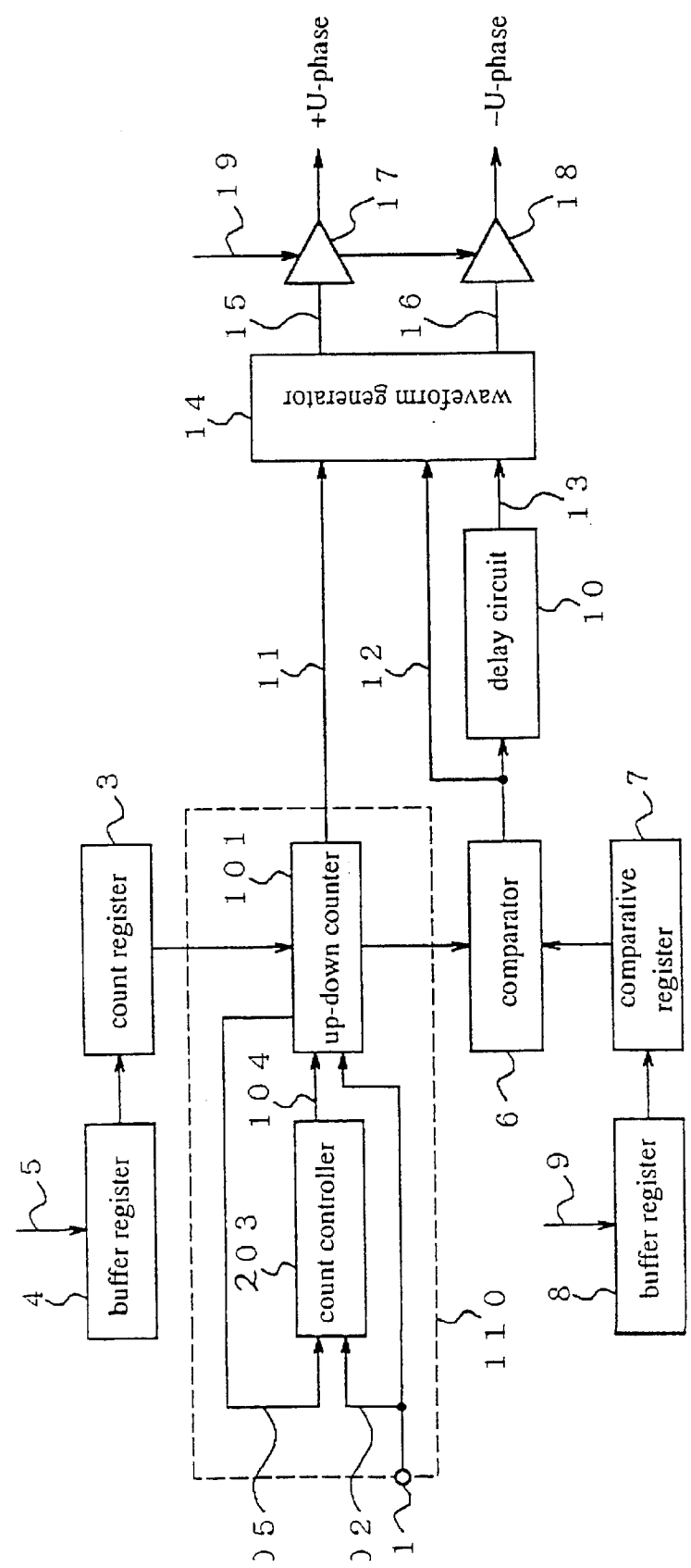
FIG. 17A is a circuit diagram illustrative of a circuit configuration of a first pulse width modulation waveform generator circuit for generating +U-phase and −U-phase pulse width modulation waveforms in the second novel three-phase pulse width modulation waveform generator in a second embodiment in accordance with the present invention.

FIG. 17A is a circuit diagram illustrative of a circuit configuration of a first pulse width modulation waveform generator circuit for generating +U-phase and −U-phase pulse width modulation waveforms in the second novel three-phase pulse width modulation waveform generator. The first pulse width modulation waveform generator circuit of the three-phase pulse width modulation waveform generator has the following circuit elements. An up-down counter 101 is provided for performing up-count and down-count. The up-down counter 101 is connected to an input terminal 111 for receiving a count clock 102 from the input terminal 111. A count controller 203 is connected to the input terminal 111 for receiving the count clock 102 from the input terminal 111. The count controller 203 is also connected to the up-down counter 101 for controlling up-count and down-count operations of the up-down counter 101. The count controller 203 generates a count enable signal 104 and transmits the count enable signal 104 to the up-down counter 101, so that the up-down counter 101 operates the up-count and down-count in accordance with the count enable signal 104 from the count controller 203. The up-down counter 101 generates a count direction switching monitoring signal 105 and transmits the count direction switching monitoring signal 105 to the count controller 203. The up-down counter 101 operates the up-count or the down-count upon input of the count clock 102 from the input terminal 111 during when the count enable signal 104 is transmitted to the up-down counter 101 from the count controller 203. The count controller 203 receives the count clock 102 for counting the same, so that the count controller 203 generates the count enable signal 104 for every counting values.

The up-down counter 101 in the down-count generates the count direction switching monitoring signal 105 which indicates the switch of the count direction, for example, form the down-count to the up-count by the next effective count clock which is the count clock inputted during the count enable signal 104 appearing. If the count clock counting value is changed, then the count controller 203 changes the generation cycle of the count enable signal 104 in synchronizing with the count direction switching monitoring signal 105.

A count register 3 is connected to the up-down counter 101 for storing a switching value and sending the switching value to the up-down counter 101 so that the up-down counter 101 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 101. A comparative register 7 is connected to the comparator 6. The comparative register 7 stores data for generating a U-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 101 for receiving one of count direction signals 11 which indicate the up-count and the down-count from the up-down counter 101. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +U-phase pulse width modulation signal 15 and a −U-phase pulse width modulation signal 16. A first three-state buffer 17 is provided which has an input terminal connected to the waveform generator 14 for receiving the +U-phase pulse width modulation signal 15 from the waveform generator 14. The first three-state buffer 17 receives an output stop signal 19, so that the first three-state buffer 17 stops the output of the +U-phase pulse width modulation signal 15. A second three-state buffer 18 is provided which has an input terminal connected to the waveform generator 14 for receiving the −U-phase pulse width modulation signal 16 from the waveform generator 14. The second three-state buffer 18 receives the output stop signal 19, so that the second three-state buffer 18 stops the output of the −U-phase pulse width modulation signal 16.

Figure 17B:
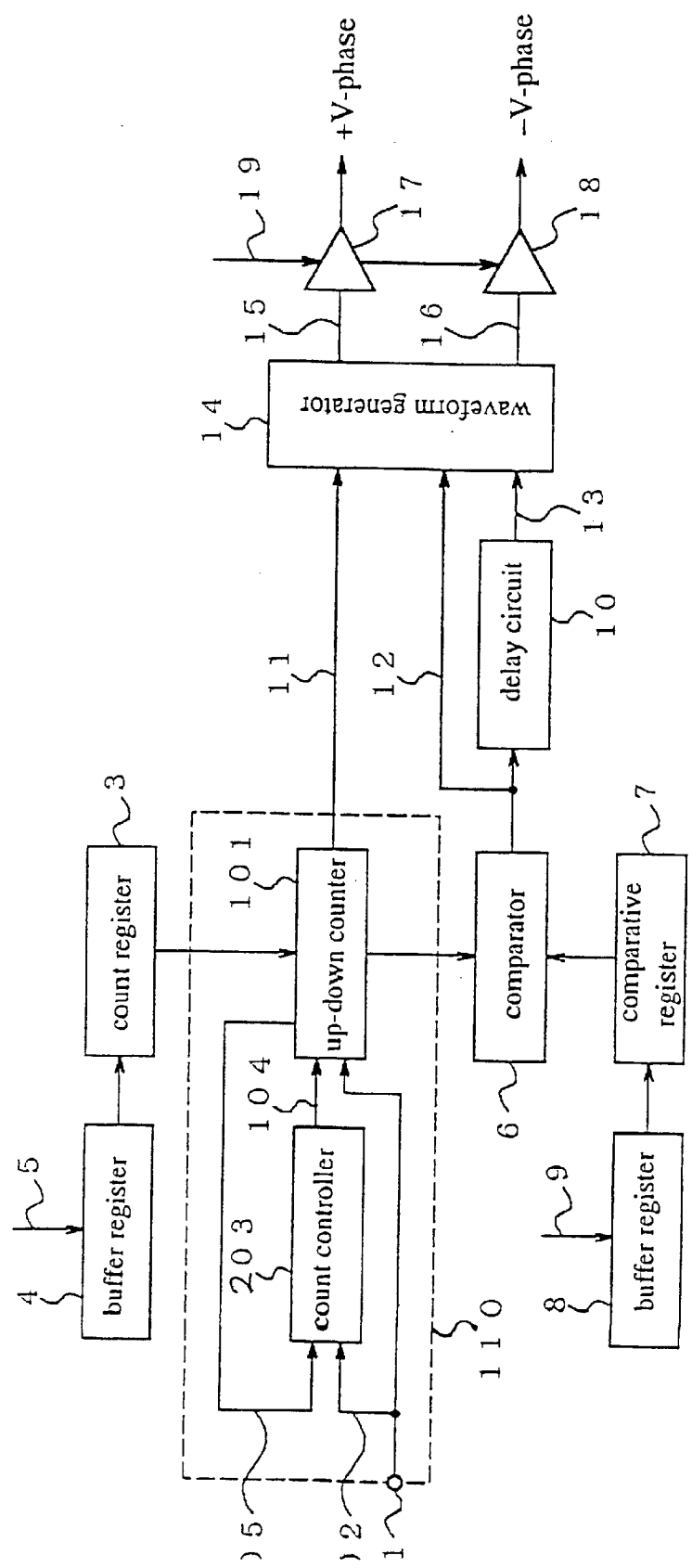
FIG. 17B is a circuit diagram illustrative of a circuit configuration of a second pulse width modulation waveform generator circuit for generating +V-phase and −V-phase pulse width modulation waveforms in the second novel three-phase pulse width modulation waveform generator in a second embodiment in accordance with the present invention.

FIG. 17B is a circuit diagram illustrative of a circuit configuration of a second pulse width modulation waveform generator circuit for generating +V-phase and −V-phase pulse width modulation waveforms in the second novel three-phase pulse width modulation waveform generator. The second pulse width modulation waveform generator circuit of the three-phase pulse width modulation waveform generator has the same circuit elements as the first pulse width modulation waveform generator circuit.

An up-down counter 101 is provided for performing up-count and down-count. The up-down counter 101 is connected to an input terminal 111 for receiving a count clock 102 from the input terminal 111. A count controller 203 is connected to the input terminal 111 for receiving the count clock 102 from the input terminal 111. The count controller 203 is also connected to the up-down counter 101 for controlling up-count and down-count operations of the up-down counter 101. The count controller 203 generates a count enable signal 104 and transmits the count enable signal 104 to the up-down counter 101, so that the up-down counter 101 operates the up-count and down-count in accordance with the count enable signal 104 from the count controller 203. The up-down counter 101 generates a count direction switching monitoring signal 105 and transmits the count direction switching monitoring signal 105 to the count controller 203. The up-down counter 101 operates the up-count or the down-count upon input of the count clock 102 from the input terminal 111 during when the count enable signal 104 is transmitted to the up-down counter 101 from the count controller 203. The count controller 203 receives the count clock 102 for counting the same, so that the count controller 203 generates the count enable signal 104 for every counting values.

The up-down counter 101 in the down-count generates the count direction switching monitoring signal 105 which indicates the switch of the count direction, for example, form the down-count to the up-count by the next effective count clock which is the count clock inputted during the count enable signal 104 appearing. If the count clock counting value is changed, then the count controller 203 changes the generation cycle of the count enable signal 104 in synchronizing with the count direction switching monitoring signal 105.

A count register 3 is connected to the up-down counter 101 for storing a switching value and sending the switching value to the up-down counter 101 so that the up-down counter 101 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 101. A comparative register 7 is connected to the comparator 6. The comparative register 7 stores data for generating a V-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 101 for receiving one of count direction signals 11 which indicate the up-count and the down-count from the up-down counter 101. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +V-phase pulse width modulation signal 15 and a −V-phase pulse width modulation signal 16. A first three-state buffer 17 is provided which has an input terminal connected to the waveform generator 14 for receiving the +V-phase pulse width modulation signal 15 from the waveform generator 14. The first three-state buffer 17 receives an output stop signal 19, so that the first three-state buffer 17 stops the output of the +V-phase pulse width modulation signal 15. A second three-state buffer 18 is provided which has an input terminal connected to the waveform generator 14 for receiving the −V-phase pulse width modulation signal 16 from the waveform generator 14. The second three-state buffer 18 receives the output stop signal 19, so that the second three-state buffer 18 stops the output of the −V-phase pulse width modulation signal 16.

Figure 17C:
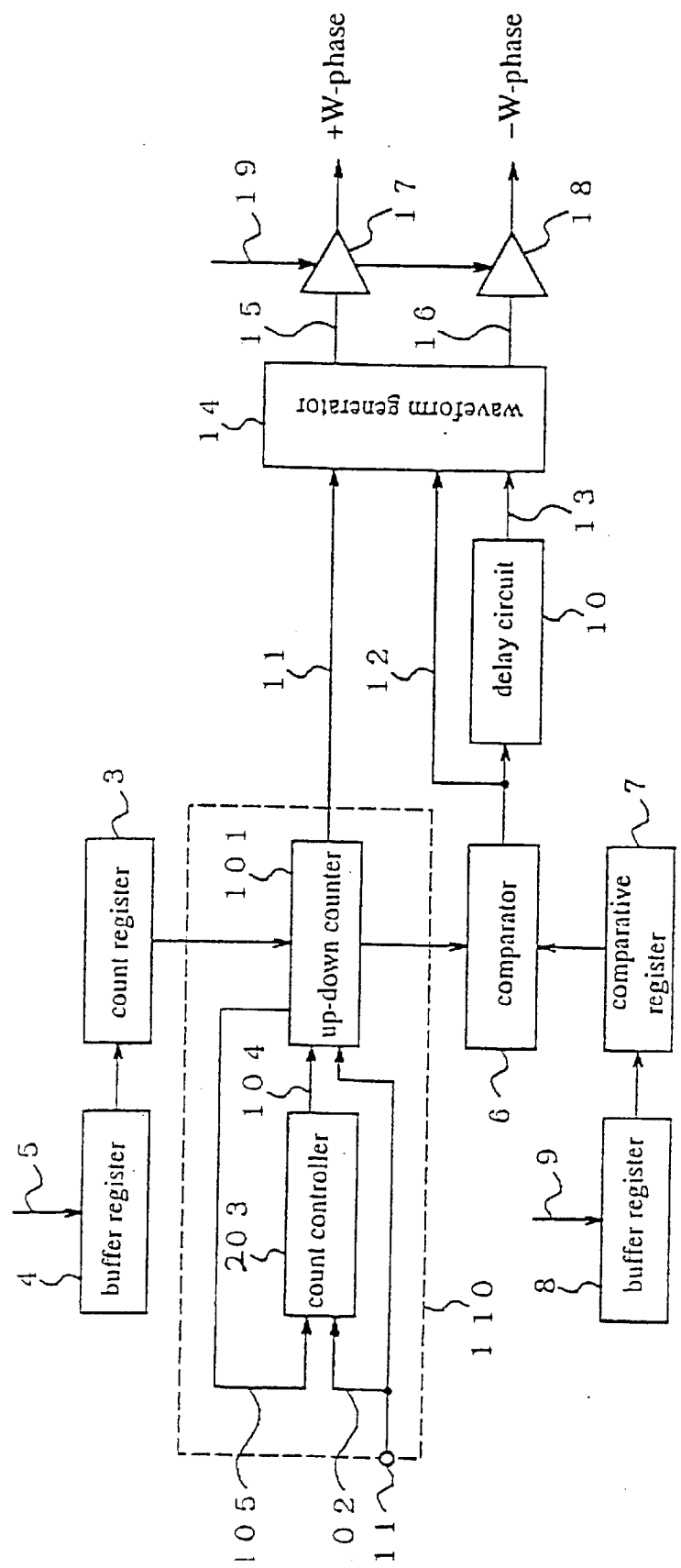
FIG. 17C is a circuit diagram illustrative of a circuit configuration of a third pulse width modulation waveform generator circuit for generating +W-phase and −W-phase pulse width modulation waveforms in the second novel three-phase pulse width modulation waveform generator in a second embodiment in accordance with the present invention.

FIG. 17C is a circuit diagram illustrative of a circuit configuration of a third pulse width modulation waveform generator circuit for generating +W-phase and −W-phase pulse width modulation waveforms in the second novel three-phase pulse width modulation waveform generator. The third pulse width modulation waveform generator circuit of the three-phase pulse width modulation waveform generator has the same circuit elements as the first pulse width modulation waveform generator circuit.

An up-down counter 101 is provided for performing up-count and down-count. The up-down counter 101 is connected to an input terminal 111 for receiving a count clock 102 from the input terminal 111. A count controller 203 is connected to the input terminal 111 for receiving the count clock 102 from the input terminal 111. The count controller 203 is also connected to the up-down counter 101 for controlling up-count and down-count operations of the up-down counter 101. The count controller 203 generates a count enable signal 104 and transmits the count enable signal 104 to the up-down counter 101, so that the up-down counter 101 operates the up-count and down-count in accordance with the count enable signal 104 from the count controller 203. The up-down counter 101 generates a count direction switching monitoring signal 105 and transmits the count direction switching monitoring signal 105 to the count controller 203. The up-down counter 101 operates the up-count or the down-count upon input of the count clock 102 from the input terminal 111 during when the count enable signal 104 is transmitted to the up-down counter 101 from the count controller 203. The count controller 203 receives the count clock 102 for counting the same, so that the count controller 203 generates the count enable signal 104 for every counting values.

The up-down counter 101 in the down-count generates the count direction switching monitoring signal 105 which indicates the switch of the count direction, for example, form the down-count to the up-count by the next effective count clock which is the count clock inputted during the count enable signal 104 appearing. If the count clock counting value is changed, then the count controller 203 changes the generation cycle of the count enable signal 104 in synchronizing with the count direction switching monitoring signal 105.

A count register 3 is connected to the up-down counter 101 for storing a switching value and sending the switching value to the up-down counter 101 so that the up-down counter 101 switches from the up-count to the down-count in accordance with the switching value. A first buffer register 4 is connected to the count register 3. The first buffer register 4 receives a first transfer enabling signal 5 and transfer data to the counter resistor 3 in accordance with the first transfer enabling signal 5. A comparator 6 is connected to the up-down counter 101. A comparative register 7 is connected to the comparator 6. The comparative register 7 stores data for generating a W-phase pulse width modulation signal. A second buffer register 8 receiving a second transfer enabling signal 9 is connected to the comparative register 7 for transferring stored data to the comparative register 7 in accordance with the second transfer enabling signal 9. A delay circuit 10 is connected to the comparator 6 for generating a dead time which prevents formation of a short circuit. A waveform generator 14 is connected to the up-down counter 101 for receiving one of count direction signals 11 which indicate the up-count and the down-count from the up-down counter 1. The waveform generator 14 is also connected to the comparator 6 for receiving a correspondence-detected signal 12 from the comparator 6. The waveform generator 14 is also connected to the delay circuit 10 for receiving a delay signal from the delay circuit 10. The waveform generator 14 generates an +W-phase pulse width modulation signal 15 and a −W-phase pulse width modulation signal 16. A first three-state buffer 17 is provided which has an input terminal connected to the waveform generator 14 for receiving the +W-phase pulse width modulation signal 15 from the waveform generator 14. The first three-state buffer 17 receives an output stop signal 19, so that the first three-state buffer 17 stops the output of the +W-phase pulse width modulation signal 15. A second three-state buffer 18 is provided which has an input terminal connected to the waveform generator 14 for receiving the −W-phase pulse width modulation signal 16 from the waveform generator 14. The second three-state buffer 18 receives the output stop signal 19, so that the second three-state buffer 18 stops the output of the −W-phase pulse width modulation signal 16.

As described above, the first, second and third pulse width modulation waveform generator circuits of the above second novel three-phase pulse width modulation waveform generator have the same circuit configuration as each other, provided that the up-down counter 101, the count controller 203, the count resistor 3 and the buffer resistor 4 are commonly provided to the first, second and third pulse width modulation waveform generator circuits, for which reason the following descriptions will be made by taking the first pulse width modulation waveform generator circuit as one example.

Figure 18:
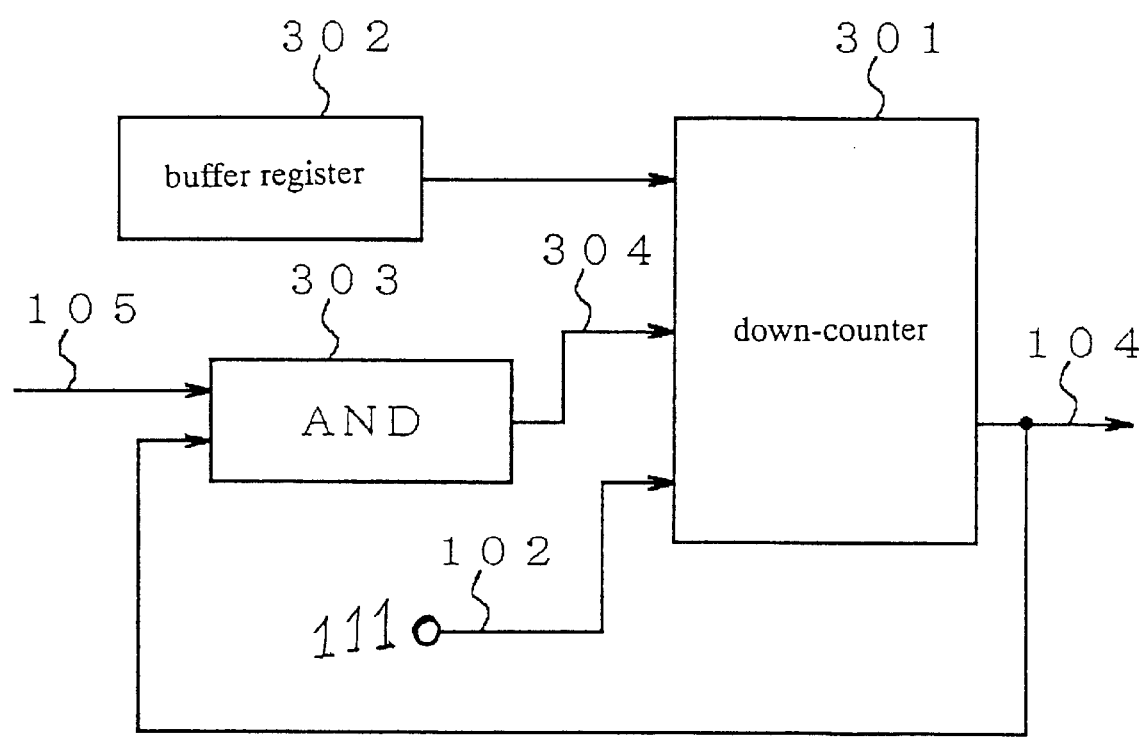
FIG. 18 is a circuit diagram illustrative of a circuit configuration of a count controller in each of the first, second and third pulse width modulation waveform generator circuits of the above second novel three-phase pulse width modulation waveform generator shown in FIGS. 17A, 17B and 17C.

FIG. 18 is a circuit diagram illustrative of a circuit configuration of a count controller in each of the first, second and third pulse width modulation waveform generator circuits of the above second novel three-phase pulse width modulation waveform generator shown in FIGS. 17A, 17B and 17C. The count controller 203 has the following circuit elements.

A down counter 301 is provided which is connected to the input terminal 111 for receiving the count clock 102 from the input terminal 111, so that the down counter 301 performs the down-count upon input of the count clock 102. A buffer register 302 is also provided for storing a counting value which is written by the central processing unit. The buffer register 302 is connected to the down counter 301 so that the buffer register 302 transmits the counting value to the down counter 301. An AND-logic circuit 303 is further provided. A first input terminal of the AND-logic circuit 303 is connected to the up-down counter 101 for receiving the count direction switching monitoring signal 105 from the up-down counter 101. A second input terminal of the AND-logic circuit 303 is also connected to the down-counter 301 for receiving the count enable signal 104 from the down-counter 301. An output terminal of the AND-logic circuit 303 is also connected to the down-counter 301. The AND-logic circuit 303 performs an AND-operation of the count enable signal 104 and the count direction switching monitoring signal 105 so that the AND-logic circuit 303 generates a load enable signal 304 and transmits the load enable signal 304 to the down-counter 301. The down-counter 301 receives the count clock 102 from the input terminal 111, the counting data from the buffer register 302 and the load enable signal 304 from the AND-logic circuit 303, so that the down-counter 301 performs the down-count upon input of the count clock 102 when the load enable signal 304 from the AND-logic circuit 303 is inactive. If the down-counted value by the down-counter 301 reaches zero, then the down-counter 301 generates the count enable signal 104. The loaded data are stored in the down-counter 301 until a new data load is made. If the down-counted value by the down-counter 301 reaches zero, then the down-counter 301 generates the count enable signal 104, whereby the AND-logic circuit 303 generates the load enable signal 304 which is then transmitted to the down-counter 301, so that the down-counter 301 loads the new data and re-starts the down-count from the newly loaded data. Namely, the down-counter 301 has a data load function.

Figure 19:
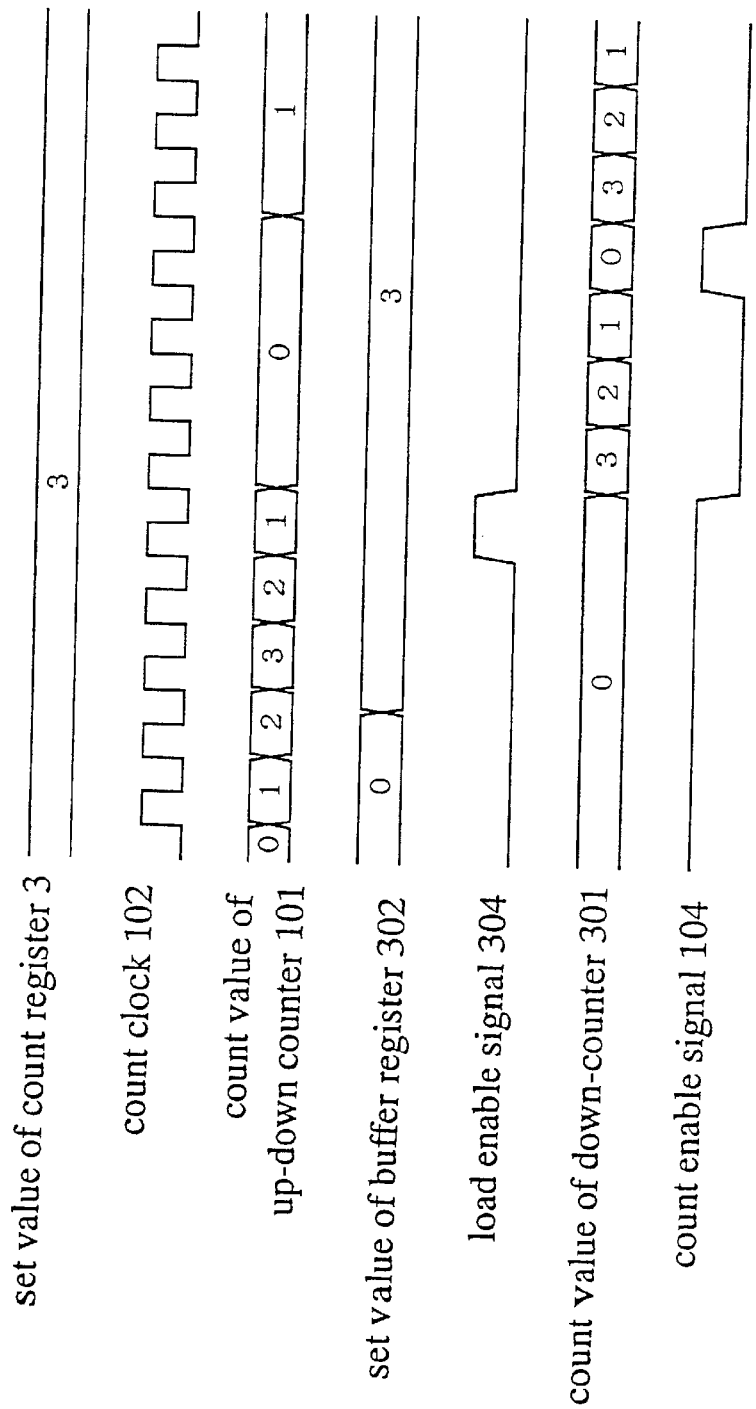
FIG. 19 is a timing chart illustrative of waveforms of a setting value of the count register, a count clock, a counted value of the up-down counter, a setting value of the buffer register, the load enable signal, a counted value of the down-counter and the count enable signal in a second embodiment in accordance with the present invention.

The following descriptions will focus on operations of the second novel three-phase pulse width modulation waveform generator in this embodiment. Operations of the count controller 203 will subsequently be described with reference to FIG. 19. FIG. 19 is a timing chart illustrative of waveforms of a setting value of the count register, a count clock, a counted value of the up-down counter, a setting value of the buffer register, the load enable signal, a counted value of the down-counter and the count enable signal.

The down-counter 301 receives the count clock 102 from the input terminal 111, the counting data from the buffer register 302 and the load enable signal 304 from the AND-logic circuit 303, so that the down-counter 301 performs the down-count upon input of the count clock 102 when the load enable signal 304 from the AND-logic circuit 303 is inactive. If the down-counted value by the down-counter 301 reaches zero, then the down-counter 301 generates the count enable signal 104. The loaded data are stored in the down-counter 301 until a new data load is made. If the down-counted value by the down-counter 301 reaches zero, then the down-counter 301 generates the count enable signal 104, whereby the AND-logic circuit 303 generates the load enable signal 304 which is then transmitted to the down-counter 301, so that the down-counter 301 loads the new data and re-starts the down-count from the newly loaded data.

The above second novel three-phase pulse width modulation waveform generator is capable of reducing the load to the central processing unit in generating the three-phase pulse width modulation waveforms.

The above second novel three-phase pulse width modulation waveform generator is capable of reducing the load to the central processing unit in the process for changing the output frequency in order to generate the three-phase pulse width modulation waveforms.

The above second novel three-phase pulse width modulation waveform generator is capable of changing carrier cycles by switching count cycles of an up-down counter, which serve as a base for the carrier frequency, wherein the switch is made without discontinuation of the counting operation of the up-down counter.

The above second novel three-phase pulse width modulation waveform generator allows that a sine wave data group on a sine wave table has been referred prior to changing the carrier cycle, before this sine wave data group is utilized as another sine wave data group for a different output frequency, whereby it is unnecessary to calculate a table address in correspondence with the output frequency in referring the sine wave table.

The above second novel three-phase pulse width modulation waveform generator allows that a sine wave data group on a sine wave table has been referred prior to changing the carrier cycle, before this sine wave data group is utilized as another sine wave data group for a different output frequency, whereby it is unnecessary to calculate a step address to be used for operation for the table address.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A three-phase pulse width modulation waveform generator having at least an up-down counting circuitry which comprises:

an up-down counter for performing an up-count or a down-count upon an external input of a count clock signal; and a count controller having an output side connected to an input side of said up-down counter for sending said input side of said up-down counter a count enable signal which enables said up-down counter to perform said up-count or said down-count;

wherein said count controller has an input side which is connected to said up-down counter for receiving a count direction switching signal from said up-down counter, so that said count controller changes a cycle for generating said count enable signal in accordance with said count direction switching signal; and wherein said input side of said count controller receives said count clock and counts said count clock, so that if a counted value of said count clock by said count controller is made to correspond to a predetermined value stored in said count controller, then said count controller generates said count enable signal.

2. The three-phase pulse width modulation waveform, generator as claimed in claim 1, wherein said up-down counter generates said count direction switching signal upon receipt of a next effective input of said count clock during when said up-down counter receives said count enable signal from said count controller.

3. The three-phase pulse width modulation waveform generator as claimed in claim 2, wherein said count controller comprises:

a clock counter receiving said count clock and counting said count clock; and a counting register for storing a registered counting value; and a comparator being connected to said counting register for receiving said registered counting value from said counting register, said comparator being also connected to said clock counter for receiving a counted value from said clock counter, said comparator being also connected to said up-down counter, and said comparator comparing said counted value to said registered counting value and transmitting a count enable signal to said up-down counter when said counted value corresponds to said registered counting value.

4. The three-phase pulse width modulation waveform generator as claimed in claim 3, wherein said count controller further comprises:

an AND-logic gate having a first input terminal receiving a count direction switching monitoring signal externally inputted and a second input terminal connected to an output terminal of said comparator for receiving said count enable signal from said comparator, said AND-logic gate performing an AND-operation of a value of said count direction switching monitoring signal and a value of said count enable signal to generate a count renewal enable signal, and said AND-logic gate having an output terminal connected to said counting register for transmitting said value of said count direction switching monitoring signal to said counted register.

5. The three-phase pulse width modulation waveform generator as claimed in claim 4, wherein said count controller further more comprises:

a buffer register connected to said counting register for allowing a central processing unit to re-write a counting value and for transmitting a counting value to said counting register at the same time when said AND-logic gate generates said count renewal enable signal.

6. The three-phase pulse width modulation waveform generator as claimed in claim 2, wherein said count controller comprises:

a buffer register connected to said counting register for allowing a central processing unit to re-write a counting value stored in said buffer register;

a down-counter connected to said buffer register for receiving said counting value from said buffer register, said down-counter also receiving a count clock for counting said count clock, and said down-counter generating a count enable signal; and an AND-logic gate having a first input terminal receiving a count direction switching monitoring signal externally inputted and a second input terminal connected to an output terminal of said down-counter for receiving said count enable signal from said down-counter, said AND-logic gate performing an AND-operation of a value of said count direction switching monitoring signal and a value of said count enable signal to generate a load enable signal, and said AND-logic gate having an output terminal connected to said down-counter for transmitting said load enable signal to said down-counter.

7. An up-down counting circuitry in a pulse width modulation waveform generator circuit, said up-down counting circuitry comprising:

an up-down counter for performing an up-count or a down-count upon an external input of a count clock signal; and a count controller having an output side connected to an input side of said up-down counter for sending said input side of said up-down counter a count enable signal which enables said up-down counter to perform said up-count or said down-count;

wherein said count controller has an input side which is connected to said up-down counter for receiving a count direction switching signal from said up-down counter, so that said count controller changes a cycle for generating said count enable signal in accordance with said count direction switching signal; and wherein said input side of said count controller receives said count clock and counts said count clock, so that if a counted value of said count clock by said count controller is made to correspond to a predetermined value stored in said count controller, then said count controller generates said count enable signal.

8. The up-down counting circuitry as claimed in claim 7, wherein said up-down counter generates said count direction switching signal upon receipt of a next effective input of said count clock during when said up-down counter receives said count enable signal from said count controller.

9. The up-down counting circuitry as claimed in claim 8, wherein said count controller comprises:

a clock counter receiving said count clock and counting said count clock; and a counting register for storing a registered counting value; and a comparator being connected to said counting register for receiving said registered counting value from said counting register, said comparator being also connected to said clock counter for receiving a counted value from, said clock counter, said comparator being also connected to said up-down counter, and said comparator comparing said counted value to said registered counting value and transmitting a count enable signal to said up-down counter when said counted value corresponds to said registered counting value.

10. The up-down counting circuitry as claimed in claim 9, wherein said count controller further comprises:

an AND-logic gate having a first input terminal receiving a count direction switching monitoring signal externally inputted and a second input terminal connected to an output terminal of said comparator for receiving said count enable signal from said comparator, said AND-logic gate performing an AND-operation of a value of said count direction switching monitoring signal and a value of said count enable signal to generate a count renewal enable signal, and said AND-logic gate having an output terminal connected to said counting register for transmitting said value of said count direction switching monitoring signal to said counted register.

11. The up-down counting circuitry as claimed in claim 10, wherein said count controller further more comprises:

a buffer register connected to said counting register for allowing a central processing unit to re-write a counting value and for transmitting a counting value to said counting register at the same time when said AND-logic gate generates said count renewal enable signal.

12. The up-down counting circuitry as claimed in claim 8, wherein said count controller comprises:

a buffer register connected to said counting register for allowing a central processing unit to re-write a counting value stored in said buffer register;

a down-counter connected to said buffer register for receiving said counting value from said buffer register, said down-counter also receiving a count clock for counting said count clock, and said down-counter generating a count enable signal; and an AND-logic gate having a first input terminal receiving a count direction switching monitoring signal externally inputted and a second input terminal connected to an output terminal of said down-counter for receiving said count enable signal from said down-counter, said AND-logic gate performing an AND-operation of a value of said count direction switching monitoring signal and a value of said count enable signal to generate a load enable signal, and said AND-logic gate having an output terminal connected to said down-counter for transmitting said load enable signal to said down-counter.

* * * * *